(12) United States Patent
Sato et al.

(10) Patent No.: US 12,164,130 B2
(45) Date of Patent: Dec. 10, 2024

(54) LIGHT IRRADIATION DEVICE AND SENSOR

(71) Applicant: FUJIFILM Corporation, Tokyo (JP)

(72) Inventors: Hiroshi Sato, Minami-ashigara (JP); Yukito Saitoh, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 784 days.

(21) Appl. No.: 17/073,819

(22) Filed: Oct. 19, 2020

(65) Prior Publication Data

US 2021/0033765 A1    Feb. 4, 2021

Related U.S. Application Data

(63) Continuation of application No. PCT/JP2019/016879, filed on Apr. 19, 2019.

(30) Foreign Application Priority Data

Apr. 20, 2018 (JP) ................... 2018-081639
May 18, 2018 (JP) ................... 2018-096400

(51) Int. Cl.
*G01B 11/25* (2006.01)
*G02B 3/00* (2006.01)
(Continued)

(52) U.S. Cl.
CPC ........ *G02B 5/3016* (2013.01); *G01B 11/2513* (2013.01); *G02B 3/0006* (2013.01); *G02B 27/425* (2013.01)

(58) Field of Classification Search
CPC .. G02B 5/3016; G02B 3/0006; G02B 27/425; G02B 5/3083; G02B 27/4261; G01B 11/2513; F21S 2/00; H01S 5/02
(Continued)

(56) References Cited

U.S. PATENT DOCUMENTS 6,630,289 B1    10/2003 Kwok et al.
8,553,196 B2 *  10/2013 Schadt ................ G02B 5/3016
                                                    349/193
(Continued)

FOREIGN PATENT DOCUMENTS

CN    101535177 A    9/2009
CN    101819353 A    9/2010
(Continued)

OTHER PUBLICATIONS

Chinese Office Action and Search Report for corresponding Chinese Application No. 201980027003.5, dated Nov. 3, 2021, with English translation.
(Continued)

*Primary Examiner* — Isiaka O Akanbi
(74) *Attorney, Agent, or Firm* — Birch, Stewart, Kolasch & Birch, LLP

(57) ABSTRACT

An object of the present invention is to provide a light irradiation device which is thin and is capable of projecting an optical pattern, and a sensor which uses the light irradiation device. The object is achieved by a light irradiation device including a light emitting element which includes a plurality of light emitting units in a plane; and a liquid crystal optical element, in which the liquid crystal optical element has an optically anisotropic layer formed using a liquid crystal composition containing a liquid crystal compound, the optically anisotropic layer has a liquid crystal alignment pattern in which orientation of an optical axis derived from the liquid crystal compound continuously changes rotationally along at least one in-plane direction and has regions with different lengths of periods in a case where a length over which the orientation of the optical axis derived from the liquid crystal compound rotates by 180° in the plane is denoted by a single period.

20 Claims, 15 Drawing Sheets

(51) Int. Cl.
*G02B 5/30* (2006.01)
*G02B 27/42* (2006.01)

(58) Field of Classification Search
USPC .................................................. 356/610, 364
See application file for complete search history.

(56) References Cited

U.S. PATENT DOCUMENTS

| | | | | |
|---|---|---|---|---|
| 2008/0278675 | A1* | 11/2008 | Escuti | G02B 5/1833 359/485.02 |
| 2010/0039707 | A1 | 2/2010 | Akahane et al. | |
| 2010/0220273 | A1 | 9/2010 | Nakajima et al. | |
| 2011/0188120 | A1* | 8/2011 | Tabirian | G02B 5/1866 359/573 |
| 2011/0262844 | A1* | 10/2011 | Tabirian | G02B 5/32 430/2 |
| 2012/0169950 | A1* | 7/2012 | Tatzel | G02F 1/133528 427/532 |
| 2013/0050710 | A1* | 2/2013 | Yamaguchi | G06F 3/011 356/610 |
| 2014/0092373 | A1* | 4/2014 | Tabirian | G03F 7/20 355/71 |
| 2014/0132956 | A1* | 5/2014 | Umeda | G06F 3/017 356/402 |
| 2014/0240492 | A1* | 8/2014 | Lee | H04N 25/135 348/136 |
| 2014/0376092 | A1 | 12/2014 | Mor | |
| 2015/0071524 | A1* | 3/2015 | Lee | G06T 7/593 382/154 |
| 2015/0079302 | A1* | 3/2015 | Du | G02F 1/0136 422/131 |
| 2015/0234206 | A1* | 8/2015 | Lee | G02C 7/083 351/158 |
| 2015/0247617 | A1* | 9/2015 | Du | G02F 1/133603 362/19 |
| 2015/0276997 | A1* | 10/2015 | Tabirian | G02B 5/1828 359/573 |
| 2016/0011353 | A1 | 1/2016 | Escuti et al. | |
| 2016/0164258 | A1* | 6/2016 | Weichmann | H01S 5/423 372/27 |
| 2016/0377414 | A1* | 12/2016 | Thuries | G02B 27/1093 359/558 |
| 2017/0336543 | A1 | 11/2017 | Spring et al. | |
| 2017/0373459 | A1* | 12/2017 | Weng | G02B 27/4261 |
| 2018/0164480 | A1* | 6/2018 | Yoshida | G02F 1/1396 |
| 2019/0377117 | A1* | 12/2019 | Saitoh | B05D 3/06 |

FOREIGN PATENT DOCUMENTS

| | | |
|---|---|---|
| CN | 105229499 A | 1/2016 |
| CN | 105324631 A | 2/2016 |
| JP | 2016-519327 A | 6/2016 |
| JP | 2018-500589 A | 1/2018 |
| WO | WO 2008/056577 A1 | 5/2008 |
| WO | WO 2016/194961 A1 | 12/2018 |

OTHER PUBLICATIONS

Japanese Office Action for counterpart Japanese Application No. 2020-514467, dated Oct. 5, 2021, with English translation.

International Preliminary Report on Patentability and Written Opinion of the International Searching Authority with an English translation (forms PCT/IB/373, PCT/ISA/237 and PCT/IB/326), dated Oct. 29, 2020, for corresponding International Application No. PCT/JP2019/016879.

International Search Report (form PCT/ISA/210), dated Jul. 23, 2019, for corresponding International Application No. PCT/JP2019/016879, with an English translation.

Chinese Office Action for corresponding Chinese Application No. 201980027003.5, dated May 16, 2022, with a partial English translation.

Chinese Office Action for Chinese Application No. 201980027003.5, dated Aug. 4, 2022, with English translation.

Japanese Office Action for Japanese Application No. 2020-514467, dated Mar. 22, 2022, with English translation.

* cited by examiner

LIGHT IRRADIATION DEVICE AND SENSOR

CROSS-REFERENCE TO RELATED APPLICATIONS

This application is a Continuation of PCT International Application No. PCT/JP2019/016879 filed on Apr. 19, 2019, which claims priority under 35 U.S.C. § 119(a) to Japanese Patent Application No. 2018-081639 filed on Apr. 20, 2018 and Japanese Patent Application No. 2018-096400 filed on May 18, 2018. Each of the above applications is hereby expressly incorporated by reference, in its entirety, into the present application.

BACKGROUND OF THE INVENTION

1. Field of the Invention

The present invention relates to a light irradiation device that uses an optical element controlling a direction of light emitted from a light source, and a sensor that uses the light irradiation device.

2. Description of the Related Art

Projection of an optical pattern has been widely used as in a case of optical three-dimensional (3D) mapping.

For example, in mobile electronic devices such as smartphones, face authentication of irradiation is performed by projection of an optical pattern. Specifically, a light beam optical pattern emitted from a plurality of point light sources is projected on the face of a user, and the light reflected on the face is received by a light receiving element. The face of the user is authenticated by treating an optical image obtained by the light reception of the light receiving element and comparing the optical image with the projected optical pattern.

A small-sized light irradiation device has been used in a sensor that projects such an optical pattern in order to irradiate an object to be detected with light.

As described in US2014/0376092A, as an example, a small-sized light irradiation device distributes light emitted from a light source comprising a plurality of light emitting units in a plane in different directions using a lens to form an optical pattern. By duplicating the formed optical pattern in different directions using a diffractive optical element, the optical pattern is projected in a wide range.

Meanwhile, in US2014/0376092A, as an example, a vertical-cavity surface-emitting laser (VCSEL) is used for a surface light source comprising a plurality of light emitting units in order to miniaturize the light irradiation device.

However, mobile electronic devices such as smartphones have been desired to reduce the thicknesses thereof.

In order to solve the above-described problem, an optical light guide element described in JP2018-500589A is known. In the optical light guide element described in JP2018-500589A, reduction in thickness is attempted by employing a configuration in which incidence ray is reflected on a first reflection surface disposed at an angle of approximately 45° with respect to the incident direction of the light, the traveling direction of the light is converted into a direction orthogonal to the incident direction, the light is reflected on a second reflection surface disposed in parallel with the first reflection surface, and the light is output from the optical light guide element.

SUMMARY OF THE INVENTION

As described above, in a small-sized light irradiation device of the related art, for example, it is necessary to configure a light guide in which reflection surfaces are arranged in parallel at an angle of approximately 45° in order to reduce the thickness of a device. Therefore, the configuration of the device is complicated, and the reduction in thickness is also insufficient.

Further, in a small-sized light irradiation device of the related art, the thickness of the lens that distributes light in different directions is large, which is one of the factors that hinder the reduction in thickness.

An object of the present invention is to solve the above-described problems of the techniques of the related art and to provide a thin light irradiation device that is capable of projecting an optical pattern and a sensor that uses the light irradiation device.

In order to achieve the above-described object, an optical element of the present invention has the following configurations.

[1] A light irradiation device comprising: a light emitting element which includes a plurality of light emitting units in a plane; and a liquid crystal optical element, in which the liquid crystal optical element has an optically anisotropic layer formed using a liquid crystal composition containing a liquid crystal compound, the optically anisotropic layer has a liquid crystal alignment pattern in which orientation of an optical axis derived from the liquid crystal compound continuously changes rotationally along at least one in-plane direction and has regions with different lengths of periods in the liquid crystal alignment pattern in a case where a length over which the orientation of the optical axis derived from the liquid crystal compound rotates by 180° in the plane is denoted by a single period.

[2] The light irradiation device according to [1], in which the single period of the liquid crystal alignment pattern is gradually shortened toward the one direction in which the orientation of the optical axis derived from the liquid crystal compound in the liquid crystal alignment pattern continuously changes rotationally.

[3] The light irradiation device according to [1] or [2], in which the liquid crystal optical element is a transmission type optical element that refracts and transmits incidence ray.

[4] The light irradiation device according to [3], in which the liquid crystal alignment pattern of the optically anisotropic layer is a concentric circular pattern in which the one directions in which the orientation of the optical axis derived from the liquid crystal compound continuously changes rotationally are concentric from an inside toward an outside.

[5] The light irradiation device according to [3] or [4], in which in the liquid crystal alignment pattern of the optically anisotropic layer, each rotation direction of the orientation of the optical axis derived from the liquid crystal compound toward the one direction is identical in all the one directions.

[6] The light irradiation device according to [1] or [2], in which the optically anisotropic layer is a cholesteric liquid crystal layer formed by fixing a cholesteric liquid crystal phase.

[7] The light irradiation device according to [6], in which the direction in which the orientation of the optical axis derived from the liquid crystal compound in the liquid crystal alignment pattern continuously changes rotationally is a single direction.

[8] The light irradiation device according to [6] or [7], further comprising: a lens element which causes a plurality of light beams emitted from each of the light emitting units of the light emitting element and reflected on a cholesteric liquid crystal layer of the liquid crystal optical element to be diverged toward an outward direction from a center of the cholesteric liquid crystal layer in a surface direction or to be focused at the center of the cholesteric liquid crystal layer in the surface direction.

[9] The light irradiation device according to any one of [1] to [8], further comprising: a lens array in which small regions having a lens function are two-dimensionally arranged between the light emitting element and the liquid crystal optical element.

[10] The light irradiation device according to [9], in which one of the small regions in the lens array couples to one of the light emitting units of the light emitting element.

[11] The light irradiation device according to [9] or [10], in which the small regions of the lens array have a liquid crystal alignment pattern which is formed using the liquid crystal composition containing a liquid crystal compound and in which the orientation of the optical axis derived from the liquid crystal compound continuously changes rotationally along at least one in-plane direction, the liquid crystal alignment pattern is a concentric circular pattern in which the one directions in which the orientation of the optical axis derived from the liquid crystal compound continuously changes rotationally are concentric from an inside toward an outside, and the lens array is a liquid crystal lens array in which the small regions having the concentric circular pattern are two-dimensionally arranged.

[12] The light irradiation device according to any one of [1] to [11], further comprising: a phase difference plate between the light emitting element and the liquid crystal optical element.

[13] The light irradiation device according to [12], in which the phase difference plate is a λ/4 plate.

[14] The light irradiation device according to [12] or [13], further comprising: a polarizer which is provided upstream of the phase difference plate in a traveling direction of light.

[15] The light irradiation device according to any one of [1] to [14], in which the light emitting element emits infrared rays.

[16] The light irradiation device according to any one of [1] to [15], in which the light emitting element is a vertical-cavity surface-emitting laser.

[17] The light irradiation device according to any one of [1] to [15], in which the light emitting element is a photonic crystal laser.

[18] The light irradiation device according to any one of [1] to [17], in which the light emitting unit of the light emitting element emits light having a beam divergence angle of 3° or less.

[19] The light irradiation device according to any one of [1] to [18], further comprising: a diffractive optical element which is provided downstream of the liquid crystal optical element in a traveling direction of light.

[20] The light irradiation device according to [19], in which the diffractive optical element includes a plurality of diffraction elements having different diffraction directions.

[21] The light irradiation device according to [19] or [20], in which the diffractive optical element includes a liquid crystal diffraction element having a liquid crystal alignment pattern which is formed using the liquid crystal composition containing a liquid crystal compound and in which the orientation of the optical axis derived from the liquid crystal compound continuously changes rotationally along at least one in-plane direction.

[22] The light irradiation device according to [21], in which the diffractive optical element includes the liquid crystal diffraction element and a phase difference plate.

[23] The light irradiation device according to [22], in which the phase difference plate is a λ/4 plate.

[24] A sensor comprising: the light irradiation device according to any one of [1] to [23]; and a light receiving element.

The light irradiation device according to the aspect of the present invention is thin and capable of projecting a desired optical pattern. Further, the sensor according to the aspect of the present invention that uses the light irradiation device is thin and has a simple device configuration.

DESCRIPTION OF THE PREFERRED EMBODIMENTS

Figure 1:
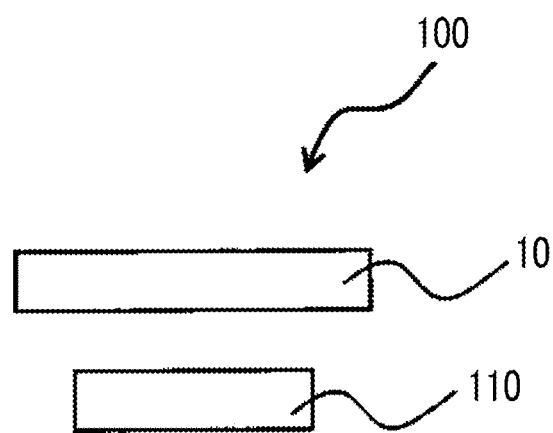
FIG. 1 is a view conceptually illustrating an example of a light irradiation device of the present invention.

Hereinafter, a light irradiation device and a sensor according to the embodiment of the present invention will be described in detail with reference to preferred embodiments illustrated in the accompanying drawings.

In the present specification, a numerical range shown using "to" indicates a range including the numerical values described before and after "to" as the lower limit and the upper limit.

In the present specification, "(meth)acrylate" is used to indicate "any one or both acrylate and methacrylate".

In the present specification, the "same" is set to include an error range usually accepted in the technical field. Further, in the present specification, the "whole", "all", and the "entire surface" are set to include an error range usually accepted in the technical field, for example, a case of 99% or greater, 95% or greater, or 90% or greater in addition to a case of 100%.

In the present specification, visible light is light having a wavelength that can be seen by human eyes among electromagnetic waves and indicates light in a wavelength range of 380 to 780 nm. Invisible light is light in a wavelength range of less than 380 nm and in a wavelength range of greater than 780 nm.

Further, although not limited thereto, among visible light, light in a wavelength range of 420 to 490 nm is blue light, light in a wavelength range of 495 to 570 nm is green light, and light in a wavelength range of 620 to 750 nm is red light. Further, although not limited thereto, among invisible light, an ultraviolet ray (ultraviolet light) is light in a wavelength range of less than 380 nm and 200 nm or greater, and an infrared ray (infrared light) is light in a wavelength range of greater than 780 nm and 12000 nm or less.

In the present specification, $Re(\lambda)$ represents an in-plane retardation at a wavelength $\lambda$. Unless otherwise specified, the wavelength $\lambda$, is set to 550 nm.

In the present specification, $Re(\lambda)$ is a value measured at a wavelength $\lambda$ using AxoScan (manufactured by Axometrics, Inc.). By inputting an average refractive index ($(nx+ny+nz)/3$) and a film thickness (d (μm)) in AxoScan, the slow axis direction (°) and "$Re(\lambda)=R0(\lambda)$" are calculated.

Further, $R0(\lambda)$ is displayed as a numerical value calculated by AxoScan and indicates $Re(\lambda)$.

The light irradiation device according to the embodiment of the present invention includes a light emitting element including a plurality of light emitting units in a plane; and a liquid crystal optical element, in which the liquid crystal optical element comprises an optically anisotropic layer formed using a liquid crystal composition containing a liquid crystal compound, and the optically anisotropic layer has a liquid crystal alignment pattern in which orientation of an optical axis derived from the liquid crystal compound continuously changes rotationally along at least one in-plane direction.

Further, the liquid crystal optical element according to the embodiment has regions with different lengths of periods in the liquid crystal alignment pattern of the optically anisotropic layer in a case where a length over which the orientation of the optical axis derived from the liquid crystal compound rotates by 180° in the plane is denoted by a single period.

In the light irradiation device according to the embodiment of the present invention, the liquid crystal optical element refracts and transmits light in a first embodiment and reflects predetermined light in a second embodiment. As will be described in detail below, in the light irradiation device according to the embodiment of the present invention, the angle of light to be incident and transmitted can be changed in the plane in a case where the optically anisotropic layer of the liquid crystal optical element has such a liquid crystal alignment pattern, in the first embodiment. Further, in the second embodiment, the light to be incident and reflected can be reflected at an angle different from specular reflection.

First Embodiment of Light Irradiation Device

FIG. 1 conceptually illustrates an example of the light irradiation device according to the first embodiment of the present invention.

A light irradiation device 100 according to the first embodiment of the illustrated example includes a liquid crystal optical element 10 and a light emitting element 110.

In the light irradiation device 100, the liquid crystal optical element 10 is disposed on a light emission side of the light emitting element 110 as illustrated in FIG. 1.

In the light irradiation device 100 illustrated in FIG. 1, a space (air layer) is formed between the light emitting element 110 and the liquid crystal optical element 10. Further, it is preferable that the space between the light emitting element 110 and the liquid crystal optical element 10 is formed such that the liquid crystal optical element 10 does not deviate from the angle of light emitted by the light emitting element 110.

However, the light irradiation device according to the embodiment of the present invention is not limited thereto, and the light emitting element 110 and the liquid crystal optical element 10 may be fixed by a bonding layer provided therebetween. In the present invention, as the bonding layer, those formed of various known materials can be used as long as the layers can bond the objects to be bonded to each other. Therefore, the bonding layer may be a layer which has a fluidity in a case of bonding the object and then is turned into a solid and formed of an adhesive, a layer which is a soft gel-like (rubber-like) solid in a case of bonding the object and then is still in the gel-like state and formed of a pressure sensitive adhesive, or a layer formed of a material having characteristics of both an adhesive and a pressure sensitive adhesive. That is, as the bonding layer, those which are known to be used for bonding sheet-like materials such as an optical transparent adhesive (optical clear adhesive (OCA)), an optical transparent double-sided tape, and an ultraviolet curable resin in an optical device and an optical element may be used. Alternatively, the light irradiation device according to the embodiment of the present invention may be configured by holding the object using a frame body, a jig, or the like instead of bonding the object using the bonding layer.

<Liquid Crystal Optical Element>

Figure 2:
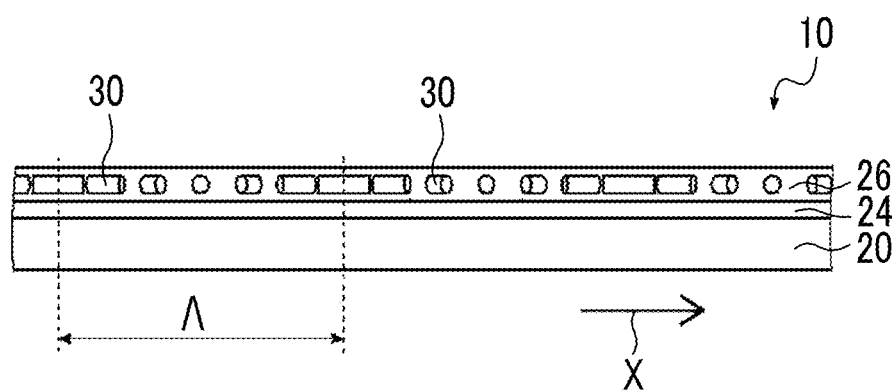
FIG. 2 is a view conceptually illustrating an example of a liquid crystal optical element.

FIG. 2 conceptually illustrates an example of the liquid crystal optical element of the present invention.

The liquid crystal optical element 10 of the illustrated example includes a support 20, an alignment film 24, and an optically anisotropic layer 26.

As described above, the liquid crystal optical element 10 has a predetermined liquid crystal alignment pattern which is formed using a composition containing a liquid crystal compound and in which an optical axis derived from the liquid crystal compound rotates. In the liquid crystal optical element 10 of the illustrated example, the optically anisotropic layer 26 is formed using the composition containing a liquid crystal compound and has the liquid crystal alignment pattern.

The liquid crystal optical element 10 of the illustrated example includes the support 20, but the liquid crystal optical element of the present invention may not include the support 20. For example, based on the configuration illustrated in FIG. 2, the support 20 may be peeled off from the liquid crystal optical element so that the liquid crystal optical element is configured of only the alignment film 24 and the optically anisotropic layer 26. Further, based on the configuration illustrated in FIG. 2, the support 20 and the alignment film 24 may be peeled off from the liquid crystal optical element so that the liquid crystal optical element is configured of only the optically anisotropic layer 26.

The light irradiation device according to the embodiment of the present invention may include a plurality of liquid crystal optical elements, including the second embodiment described below. In the case where the light irradiation device according to the embodiment of the present invention is formed by laminating a plurality of liquid crystal optical elements, liquid crystal optical elements which include the support 20 and/or the alignment film 24 and liquid crystal optical elements which do not include the support 20 and/or the alignment film 24 may be mixed.

That is, in the light irradiation device 100 according to the embodiment of the present invention, various layer configurations can be used as long as the liquid crystal optical element has an optically anisotropic layer formed using a composition containing a liquid crystal compound, the optically anisotropic layer has a liquid crystal alignment pattern in which orientation of an optical axis derived from the liquid crystal compound continuously changes rotationally along at least one in-plane direction and has regions with different lengths of periods in the liquid crystal alignment pattern in a case where a length over which the orientation of the optical axis derived from the liquid crystal compound rotates by 180° in the plane is denoted by a single period.

<<Support>>

As described above, the liquid crystal optical element 10 includes the support 20, the alignment film 24, and the optically anisotropic layer 26.

In the liquid crystal optical element 10, the support 20 supports the alignment film 24 and the optically anisotropic layer 26.

As the support 20, various sheet-like materials (films and plate-like materials) can be used as long as these materials can support the alignment film 24 and the optically anisotropic layer 26.

As the support 20, a transparent support is preferable, and examples thereof include a polyacrylic resin film such as polymethyl methacrylate, a cellulose-based resin film such as cellulose triacetate, a cycloolefin polymer-based film, polyethylene terephthalate (PET), polycarbonate, and polyvinyl chloride. Examples of the cycloolefin polymer-based film include "ARTON" (trade name, manufactured by JSR Corporation) and "ZEONOR" (trade name, manufactured by Nippon Zeon Corporation).

The support is not limited to a flexible film and may be a non-flexible substrate such as a glass substrate.

The thickness of the support 20 is not limited, and the thickness thereof which enables the alignment film 24 and the optically anisotropic layer 26 to be held may be appropriately set depending on the applications of the liquid crystal optical element 10, the material forming the support 20, and the like.

The thickness of the support 20 is preferably in a range of 1 to 1000 µm, more preferably in a range of 3 to 250 µm, and still more preferably in a range of 5 to 150 µm.

An additive such as an ultraviolet absorbing agent may be added to the support 20. It is preferable that an ultraviolet absorbing agent is added to the support 20 from the viewpoint of improving the light fastness of the liquid crystal optical element 10.

<<Alignment Film>>

In the liquid crystal optical element 10, the alignment film 24 is formed on a surface of the support 20.

The alignment film 24 is an alignment film for aligning the liquid crystal compound 30 in a predetermined liquid crystal alignment pattern in a case where the optically anisotropic layer 26 of the liquid crystal optical element 10 is formed.

As will be described below, the optically anisotropic layer 26 in the liquid crystal optical element 10 has a liquid crystal alignment pattern in which the orientation of optical axes 30A (see FIG. 4) derived from the liquid crystal compounds 30 continuously changes rotationally along one direction in the plane (an X direction indicated by the arrow described below). Therefore, the alignment film 24 of the liquid crystal optical element 10 is formed so that the optically anisotropic layer 26 can form the liquid crystal alignment pattern.

In the description below, "the orientation of the optical axes 30A rotates" is also simply referred to as "the optical axes 30A rotate".

As the alignment film 24, various known films can be used.

Examples thereof include a rubbing treatment film formed of an organic compound such as a polymer, an obliquely deposited film of an inorganic compound, a film having microgrooves, and a film obtained by accumulating Langmuir-Blodget (LB) films formed of an organic compound such as ω-tricosanoic acid, dioctadecylmethylammonium chloride, or methyl stearate according to the Langmuir-Blodgett method.

The alignment film formed by performing a rubbing treatment can be formed by rubbing the surface of the polymer layer several times in a certain direction using paper or cloth.

As the material used for the alignment film, polyimide, polyvinyl alcohol, polymers containing polymerizable groups described in JP1997-152509A (JP-H09-152509A), and materials used for forming alignment films described in JP2005-097377A, JP2005-099228A, and JP2005-128503A are preferably used.

In the liquid crystal optical element 10, a so-called photo-alignment film obtained by irradiating a photo-alignment material with polarized light or non-polarized light to obtain an alignment film is suitably used as the alignment film 24. That is, in the liquid crystal optical element 10 of the present invention, a photo-alignment film formed by coating the support 20 with a photo-alignment material is suitably used as the alignment film.

The photo-alignment film can be irradiated with polarized light in the vertical direction or oblique direction, and the photo-alignment film can be irradiated with non-polarized light in an oblique direction.

Preferred examples of the photo-alignment material used for the photo-alignment film which can be used in the present invention include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having photo-alignment units described in JP2002-265541A and JP2002-317013A, photo-crosslinkable silane derivatives described in JP4205195B and JP4205198B, photo-crosslinkable polyimides, photo-crosslinkable polyamides, or photo-crosslinkable esters described in JP2003-520878A, JP2004-529220A, and JP4162850B, and compounds capable of photodimerization, particularly cinnamate compounds, chalcone compounds, and coumarin compounds described in JP1997-118717A (JP-H09-118717A), JP1998-506420A (JP-H10-506420A), JP2003-505561A, WO2010/150748A, JP2013-177561A, and JP2014-012823A.

Among these, azo compounds, photo-crosslinkable polyimides, photo-crosslinkable polyamides, photo-crosslinkable esters, cinnamate compounds, or chalcone compounds are suitably used.

The thickness of the alignment film 24 is not limited, and the thickness at which the required alignment function can be obtained may be appropriately set according to the material for forming the alignment film 24.

The thickness of the alignment film 24 is preferably in a range of 0.01 to 5 μm and more preferably in a range of 0.05 to 2 μm.

The method of forming the alignment film is not limited, and various known methods can be used depending on the material for forming the alignment film. Examples thereof include a method of forming an alignment pattern by coating the surface of the support 20 with an alignment film, drying the alignment film, and exposing the alignment film with laser light.

Figure 7:
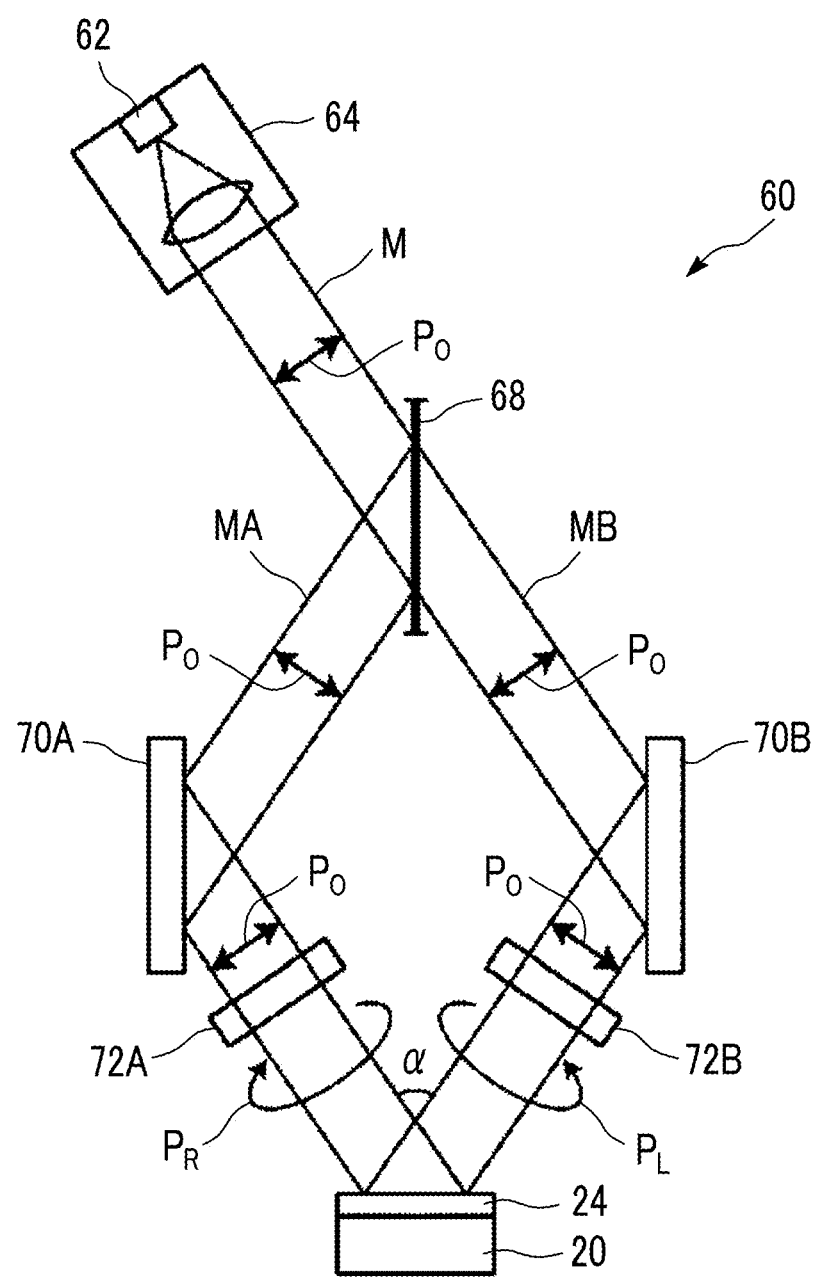
FIG. 7 is a view conceptually illustrating an example of an exposure device that exposes an alignment film of the liquid crystal optical element illustrated in FIG. 2.

FIG. 7 conceptually illustrates an example of an exposure device that exposes the alignment film 24 to form the above-described alignment pattern.

An exposure device 60 illustrated in FIG. 7 comprises a light source 64 comprising a laser 62, a beam splitter 68 that separates laser light M emitted from the laser 62 into two light beams, which are a light beam MA and a light beam MB, mirrors 70A and 70B respectively disposed on optical paths of the two separated light beams MA and MA, and λ/4 plates 72A and 72B.

Although not illustrated, the light source 64 emits linearly polarized light $P_O$. The λ/4 plate 72A converts the linearly polarized light $P_O$ (the light beam MA) into right circularly polarized light PR, and the λ/4 plate 72B converts the linearly polarized light $P_O$ (the light beam MB) into left circularly polarized light $P_L$.

The support 20 having the alignment film 24 before the formation of the alignment pattern is disposed in an exposed portion, the two light beams MA and MB intersect each other on the alignment film 24 so as to interfere with each other, and the alignment film 24 is irradiated with the interference light to expose the alignment film 24.

Due to the interference here, the polarization state of the light to be applied to the alignment film 24 periodically changes in the form of interference fringes. In this manner, in the alignment film 24, an alignment pattern in which the alignment state periodically changes can be obtained.

In the exposure device 60, the period of the alignment pattern can be adjusted by changing a crossing angle α of the two light beams MA and MB. That is, in the exposure device 60, the length of a single period at which the optical axis 30A rotates by 180° (a single period Λ described below) in one direction in which the optical axis 30A rotates can be adjusted by adjusting the crossing angle α, in the alignment pattern in which the optical axis 30A derived from the liquid crystal compound 30 continuously rotates along one direction.

By forming the optically anisotropic layer on the alignment film having the alignment pattern in which the alignment state periodically changes, the optically anisotropic layer 26 having the liquid crystal alignment pattern in which the optical axis 30A derived from the liquid crystal compound 30 continuously rotates toward one direction can be formed.

Further, the rotation directions of the optical axis 30A can be reversed by rotating the optical axes of the λ/4 plates 72A and 72B by 90°.

In the liquid crystal optical element of the present invention, the alignment film is provided as a preferred embodiment and is not an indispensable constituent element.

For example, in a case where the alignment pattern is formed on the support 20 according to a method of performing a rubbing treatment on the support 20 or a method of processing the support 20 with laser light or the like, a configuration in which the optically anisotropic layer 26 or the like has the liquid crystal alignment pattern in which the orientation of the optical axes 30A derived from the liquid crystal compounds 30 continuously changes rotationally along at least one in-plane direction can be employed.

<<Optically Anisotropic Layer>>

In the liquid crystal optical element 10, the optically anisotropic layer 26 is formed on the surface of the alignment film 24.

In FIG. 2 (and FIGS. 5 to 6 described below), the optically anisotropic layer 26 is shown to have only the liquid crystal compound 30 (molecules of the liquid crystal compound) on the surface of the alignment film in order to simplify the drawing and clearly show the configuration of the liquid crystal optical element 10. However, as conceptually illustrated in FIG. 3, the optically anisotropic layer 26 has a structure in which the aligned liquid crystal compounds 30 are stacked in the thickness direction similarly to the optically anisotropic layer formed using a composition containing a typical liquid crystal compound.

As described above, in the liquid crystal optical element 10, the optically anisotropic layer 26 is formed using the composition containing the liquid crystal compound. In a case where the value of the in-plane retardation is set to λ/2, the optically anisotropic layer 26 has a function as a typical λ/2 plate, that is, a function of imparting a phase difference of a half wavelength, that is, 180° to two linearly polarized light components that are contained in light incident on the optically anisotropic layer and are orthogonal to each other.

The optically anisotropic layer 26 has a liquid crystal alignment pattern in which the orientation of the optical axes 30A derived from the liquid crystal compounds 30 in the plane continuously changes rotationally in one direction indicated by the arrow X.

Further, the optical axis 30A derived from the liquid crystal compound 30 is an axis having the highest refractive index in the liquid crystal compound 30, that is, a so-called slow axis. For example, in a case where the liquid crystal compound 30 is a rod-like liquid crystal compound, the optical axis 30A is along the long axis direction in the form of a rod.

In the description below, "one direction indicated by the arrow X" is also simply referred to as the "arrow X direction". Further, in the description below, the optical axis 30A derived from the liquid crystal compound 30 is also referred to as the "optical axis 30A of the liquid crystal compound 30" or the "optical axis 30A".

In the optically anisotropic layer 26, the liquid crystal compounds 30 are two-dimensionally arranged in the plane parallel to the arrow X direction and the Y direction orthogonal to the arrow X direction. In FIGS. 2 and 3, and FIGS. 5 and 6 described below, the Y direction is a direction orthogonal to the paper surface.

Figure 4:
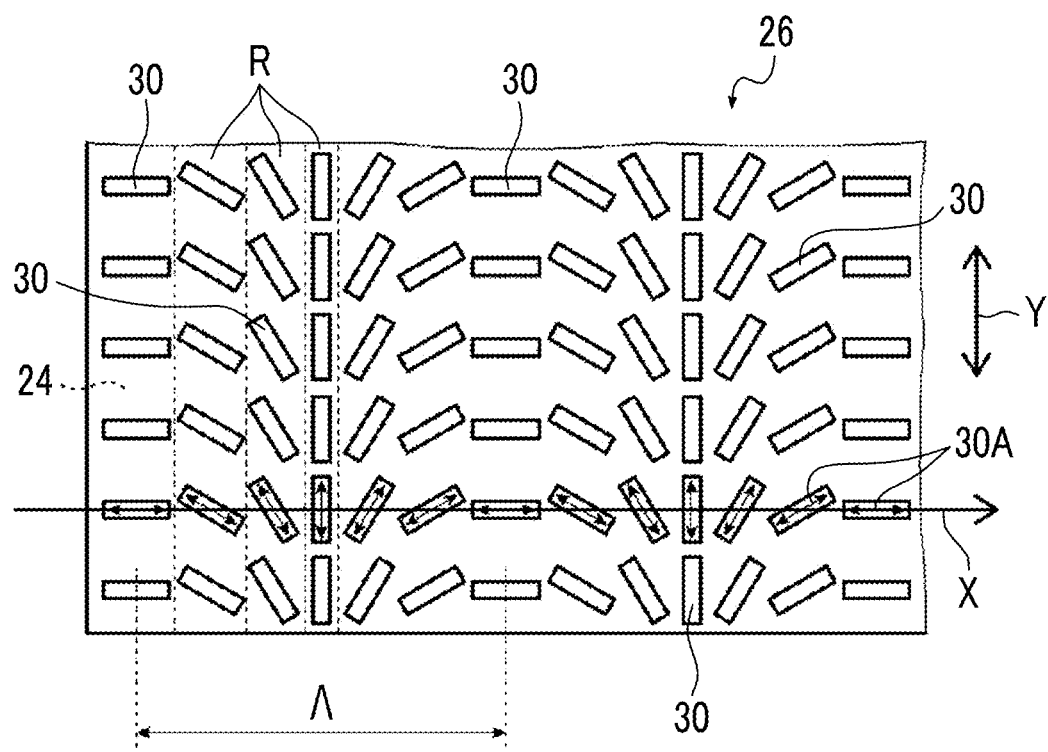
FIG. 4 is a plan view illustrating the optically anisotropic layer of the liquid crystal optical element illustrated in FIG. 2.

FIG. 4 is a plan view conceptually illustrating the optically anisotropic layer 26.

Further, the plan view is a view illustrating the liquid crystal optical element 10 seen from above in FIG. 2, that is, a view illustrating the liquid crystal optical element 10 seen in the thickness direction(=the lamination direction of each layer (film)). That is, the plan view is a view illustrating the optically anisotropic layer 26 seen in the direction orthogonal to the main surface.

Figure 3:
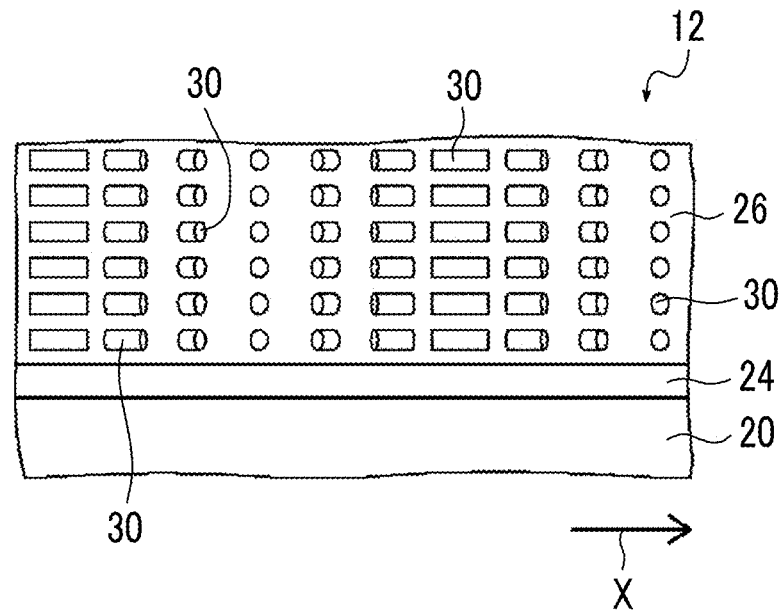
FIG. 3 is a view conceptually illustrating an optically anisotropic layer of the liquid crystal optical element illustrated in FIG. 2.

Further, in FIG. 4, only the liquid crystal compound 30 on the surface of the alignment film 24 is shown as the liquid crystal compound 30 similar to the case of FIG. 2 in order to clearly show the configuration of the liquid crystal optical element 10 of the present invention. However, as described above, the optically anisotropic layer 26 has a structure in which the liquid crystal compounds 30 are stacked in the thickness direction from the liquid crystal compounds 30 on the surface of the alignment film 24 as illustrated in FIG. 3.

The optically anisotropic layer 26 has a liquid crystal alignment pattern in which the orientation of the optical axes 30A derived from the liquid crystal compounds 30 in the plane continuously changes rotationally along the arrow X direction.

The expression "the orientation of the optical axes 30A of the liquid crystal compounds 30 continuously changes rotationally in the arrow X direction (a predetermined one direction)" indicates that, specifically, the angles between the optical axes 30A of the liquid crystal compounds 30 arranged along the arrow X direction and the arrow X direction vary depending on the position of the arrow X direction, and the angles between the optical axes 30A and the arrow X direction sequentially change from θ to θ+180° or from θ to θ−180° along the arrow X direction.

Further, a difference in angle of the optical axes 30A of the liquid crystal compounds 30 adjacent to each other in the arrow X direction is preferably 45° or less, more preferably 15° or less, and still more preferably being smaller than 15°.

Meanwhile, in the liquid crystal compounds 30 forming the optically anisotropic layer 26, the liquid crystal compounds 30 in which the orientations of the optical axes 30A are the same as one another are arranged at equal intervals in the Y direction orthogonal to the arrow X direction, that is, the Y direction orthogonal to one direction in which the optical axes 30A continuously rotate.

That is, in the liquid crystal compounds 30 forming the optically anisotropic layer 26, the angles between the orientations of the optical axes 30A and the arrow X direction are the same in the liquid crystal compounds 30 arranged in the Y direction.

In such a liquid crystal alignment pattern of the liquid crystal compounds 30 in the optically anisotropic layer 26, the length (distance) over which the optical axes 30A of the liquid crystal compounds 30 rotates by 180° in the arrow X direction in which the orientation of the optical axes 30A continuously changes in the plane rotationally is defined by the length Λ of a single period in the liquid crystal alignment pattern. In the description below, the length Λ of a single period is also referred to as a single period Λ. That is, a single period Λ in the liquid crystal alignment pattern is defined by the distance from where the angle between the optical axis 30A of the liquid crystal compound 30 and the arrow X direction is θ and to where the angle therebetween is θ+180°.

That is, the distance between the centers of two liquid crystal compounds 30 having the same angle with respect to the arrow X direction in the arrow X direction is set as a single period Λ. Specifically, as illustrated in FIG. 3, the distance between the centers of two liquid crystal compounds 30 in which the arrow X direction and the direction of the optical axis 30A coincide with each other in the arrow X direction is set as a single period Λ.

In the liquid crystal optical element 10 of the present invention, the liquid crystal alignment pattern of the optically anisotropic layer repeats this single period Λ in the arrow X direction, that is, in one direction in which the orientation of the optical axes 30A continuously changes rotationally.

As described above, in the optically anisotropic layer, the liquid crystal compounds arranged in the Y direction have the same angle between the optical axes 30A and the arrow X direction (one direction in which the orientation of the optical axes of the liquid crystal compounds 30 rotates). A region in which the liquid crystal compound 30 having the same angle formed by the optical axis 30A and the arrow X direction is arranged in the Y direction is referred to as a region R.

In this case, the value of the in-plane retardation (Re) in each region R is preferably a half wavelength, that is, $\lambda/2$. These in-plane retardations are calculated by the product of the difference Δn in refractive index associated with the refractive index anisotropy of the region R and the thickness of the optically anisotropic layer. Here, the difference in refractive index associated with the refractive index anisotropy of the region R in the optically anisotropic layer indicates a difference in refractive index defined based on a difference between the refractive index in the direction of the slow axis in the plane of the region R and the refractive index in the direction orthogonal to the direction of the slow axis. That is, the difference Δn in refractive index associated with the refractive index anisotropy of the region R is the same as the difference between the refractive index of the liquid crystal compound 30 in the direction of the optical axis 30A and the refractive index of the liquid crystal compound 30 in the direction perpendicular to the optical axis 30A in the plane of the region R. That is, the difference Δn in refractive index described above is the same as the difference between refractive indices of the liquid crystal compounds.

In a case where circularly polarized light is incident on such an optically anisotropic layer 26, the light is refracted and the direction of the circularly polarized light is changed.

Figure 5:
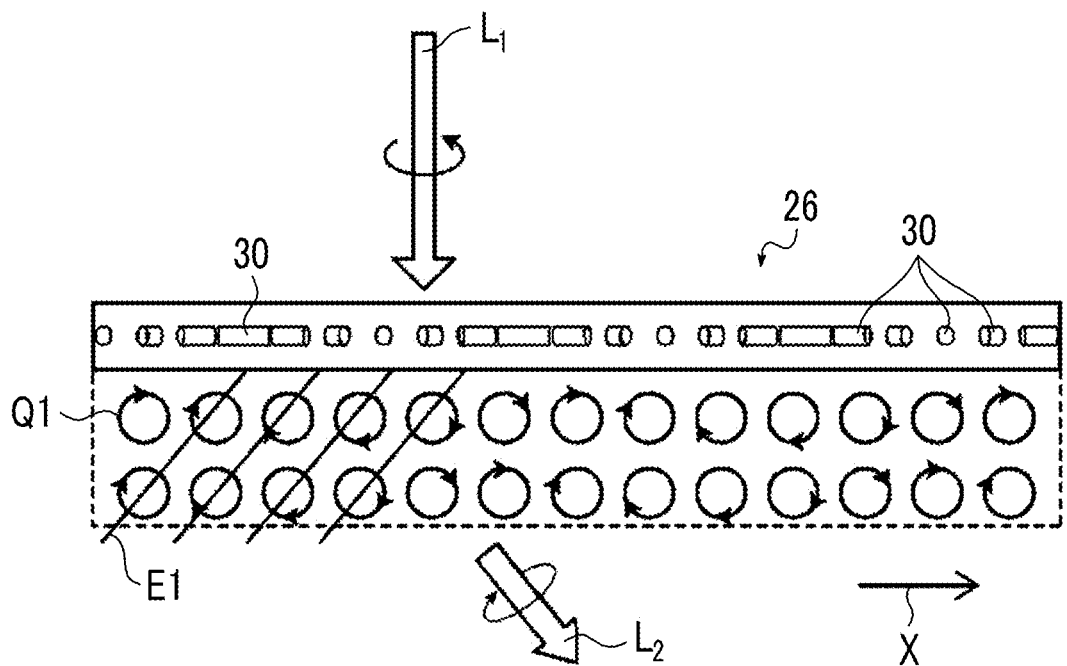
FIG. 5 is a conceptual view illustrating the operation of the optically anisotropic layer of the liquid crystal optical element illustrated in FIG. 2.

This operation is conceptually illustrated in FIG. 5. Further, in the optically anisotropic layer 26, the product of the difference in refractive index of the liquid crystal compound and the thickness of the optically anisotropic layer is set to λ/2.

As illustrated in FIG. 5, in a case where the product of the difference between the refractive indices of the liquid crystal compounds in the optically anisotropic layer 26 and the thickness of the optically anisotropic layer is λ/2 and an incidence ray $L_1$ which is left circularly polarized light is incident on the optically anisotropic layer 26, a phase difference of 180° is imparted by the incidence ray $L_1$ passing through the optically anisotropic layer 26, and transmitted light $L_2$ is converted into right circularly polarized light.

Further, in a case where the incidence ray $L_1$ passes through the optically anisotropic layer 26, the absolute phase thereof changes according to the orientation of the optical axes 30A of the respective liquid crystal compounds 30. At this time, since the orientation of the optical axes 30A changes rotationally along the arrow X direction, the amount of change in the absolute phase of the incidence ray $L_1$ varies depending on the orientation of the optical axes 30A. Further, since the liquid crystal alignment pattern formed on the optically anisotropic layer 26 is a periodic pattern in the arrow X direction, a periodic absolute phase Q1 is imparted to the incidence ray $L_1$ that has passed through the optically anisotropic layer 26 in the arrow X direction corresponding to the orientation of each optical axis 30A as illustrated in FIG. 5. In this manner, an equiphase surface E1 inclined in a direction opposite to the arrow X direction is formed.

Therefore, the transmitted light $L_2$ is refracted so as to be inclined in a direction perpendicular to the equiphase surface E1 and travels in a direction different from the traveling direction of the incidence ray $L_1$. In this manner, the incidence ray $L_1$ of the left circularly polarized light is converted into the transmitted light $L_2$ of the right circularly polarized light that is inclined by a certain angle in the arrow X direction with respect to the incident direction.

Figure 6:
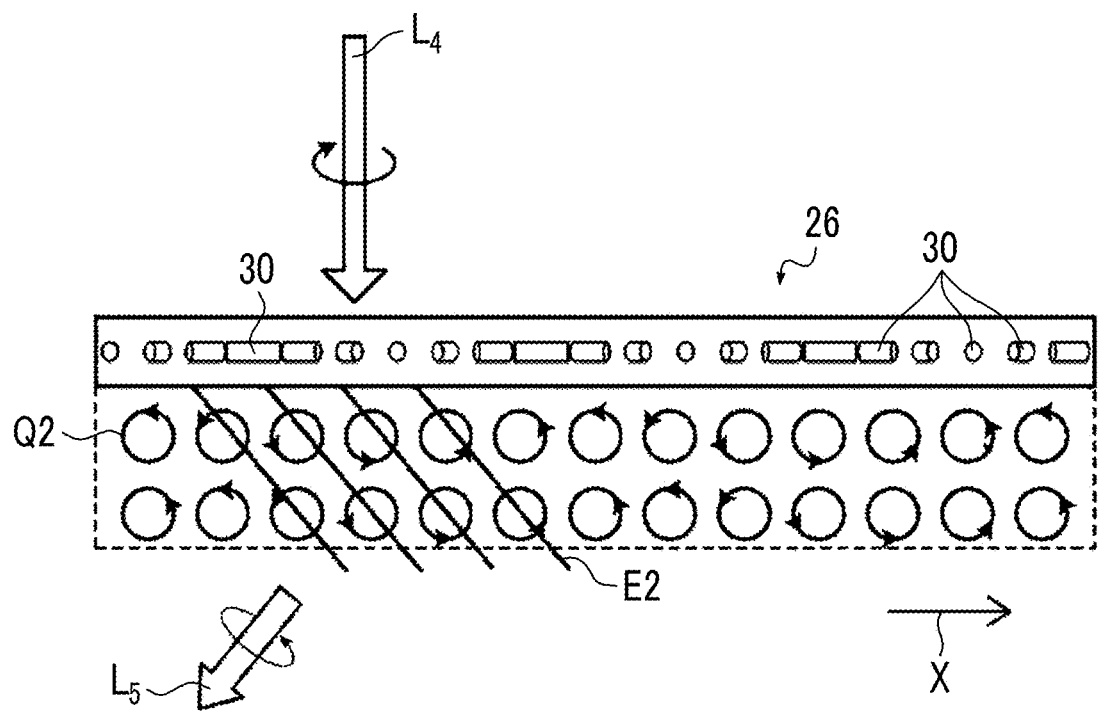
FIG. 6 is a conceptual view illustrating the operation of the optically anisotropic layer of the liquid crystal optical element illustrated in FIG. 2.

Meanwhile, as conceptually illustrated in FIG. 6, in the case where the product of the difference between the refractive indices of the liquid crystal compounds in the optically anisotropic layer 26 and the thickness of the optically anisotropic layer is 212 and an incidence ray $L_4$ which is right circularly polarized light is incident on the optically anisotropic layer 26, a phase difference of 180° is imparted by the incidence ray $L_4$ passing through the optically anisotropic layer 26, and the incidence ray is converted into transmitted light $L_5$ of left circularly polarized light.

Further, in a case where the incidence ray $L_4$ passes through the optically anisotropic layer 26, the absolute phase thereof changes according to the orientation of the optical axes 30A of the respective liquid crystal compounds 30. At this time, since the orientation of the optical axes 30A changes rotationally along the arrow X direction, the amount of change in the absolute phase of the incidence ray $L_4$ varies depending on the orientation of the optical axes 30A. Further, since the liquid crystal alignment pattern formed on the optically anisotropic layer 26 is a periodic pattern in the arrow X direction, a periodic absolute phase Q2 is imparted to the incidence ray $L_4$ that has passed through the optically anisotropic layer 26 in the arrow X direction corresponding to the orientation of each optical axis 30A as illustrated in FIG. 6.

Here, since the incidence ray $L_4$ is right circularly polarized light, the absolute phase Q2 which is periodic in the arrow X direction corresponding to the orientation of the optical axes 30A is opposite to the incidence ray $L_1$ that is left circularly polarized light. As a result, the incidence ray $L_4$ has an equiphase surface E2 formed by being inclined in the arrow X direction that is opposite to the case of the incidence ray $L_1$.

Therefore, the incidence ray $L_4$ is refracted so as to be inclined in a direction perpendicular to the equiphase surface E2 and travels in a direction different from the traveling direction of the incidence ray $L_4$. In this manner, the incidence ray $L_4$ is converted into transmitted light $L_5$ of left circularly polarized light that is inclined by a certain angle in a direction opposite to the arrow X direction with respect to the incident direction.

In the optically anisotropic layer 26, the value of the in-plane retardation of a plurality of regions R is preferably a half wavelength. In particular, it is preferable that the "in-plane retardation $Re(\lambda)=\Delta n_\lambda \times d$" of the plurality of regions R of the optically anisotropic layer 26 with respect to the incidence ray having the wavelength of λ nm is within the range defined by Expression (1). Here, $\Delta n_\lambda$ is a difference in refractive index associated with the refractive index anisotropy of the region R in a case where the wavelength of incidence ray is λ nm, and d represents the thickness of the optically anisotropic layer 26.

$$0.7\times(\lambda/2)\text{ nm} \leq \Delta n_\lambda \times d \leq 1.3\times(\lambda/2)\text{ nm} \quad (1)$$

That is, in a case where the in-plane retardation "$Re(\lambda)=\Delta n_\lambda \times d$" of the plurality of regions R of the optically anisotropic layer 26 satisfies Expression (1), a sufficient amount of circularly polarized light components of light that has been incident on the optically anisotropic layer 26 can be converted into circularly polarized light traveling in a direction inclined in a forward or backward direction with respect to the arrow X direction.

In the in-plane retardation "$Re(\lambda)=\Delta n_\lambda \times d$", it is more preferable that "$0.8\times(\lambda/2)\text{ nm} \leq \Delta n_\lambda \times d \leq 1.2\times(\lambda/2)\text{ nm}$" is satisfied and still more preferable that "$0.9\times(\lambda/2)\text{ nm} \leq \Delta n_\lambda \times d \leq 1.1\times(\lambda/2)\text{ nm}$" is satisfied.

Further, the value of the in-plane retardation of the plurality of regions R in the optically anisotropic layer 26 can be used outside the range of Expression (1). Specifically, in a case where "$\Delta n_\lambda \times d < 0.7\times(\lambda/2)\text{ nm}$" or "$1.3\times(\lambda/2) < \Delta n_\lambda \times d$" is satisfied, the light can be divided into light traveling in the same direction as the traveling direction of the incidence ray and light traveling in a direction different from the traveling direction of incidence ray. In a case where $\Delta n_\lambda \times d$ approaches 0 nm or λ nm, the amount of components of light traveling in the same direction as the traveling direction of incidence ray increases, and the amount of components of light traveling in a direction different from the traveling direction of incidence ray decreases.

Here, the angle of refraction of the transmitted light $L_2$ and $L_5$ can be adjusted by changing the single period Λ of the liquid crystal alignment pattern formed on the optically anisotropic layer 26. Specifically, since the light beams passing through the liquid crystal compounds 30 adjacent to each other interfere with each other as the single period Λ of the liquid crystal alignment pattern decreases, the transmitted light $L_2$ and $L_5$ can be largely refracted.

Further, by setting the rotation direction of the optical axes 30A of the liquid crystal compounds 30 which rotate along the arrow X direction as the opposite direction, the refraction direction of the transmitted light can be set as the opposite direction.

The optically anisotropic layer 26 is formed by curing a liquid crystal composition containing a rod-like liquid crystal compound or a disk-like liquid crystal compound and has a liquid crystal alignment pattern in which the optical axes of the rod-like liquid crystal compound or the disk-like liquid crystal compound are aligned as described above.

The optically anisotropic layer 26 formed of a cured layer of a liquid crystal composition can be obtained by forming the alignment film 24 on the support 20, coating the alignment film 24 with a liquid crystal composition, and curing the composition. Further, the optically anisotropic layer 26 functions as a so-called λ/2 plate. However, in the present invention, an embodiment in which a laminate integrally comprising the support 20 and the alignment film 24 functions as a λ/2 plate is exemplified.

Further, the liquid crystal composition for forming the optically anisotropic layer 26 contains a rod-like liquid crystal compound or a disk-like liquid crystal compound and may further contain other components such as a leveling agent, an alignment control agent, a polymerization initiator, and an alignment assistant.

It is preferable that the optically anisotropic layer 26 has a wide band with respect to the wavelength of incidence ray and is formed using a liquid crystal material having a birefringence which is inversely dispersed.

Further, it is also preferable that the optically anisotropic layer is made to have a substantially wide band with respect to the wavelength of incidence ray by imparting a twist component to the liquid crystal composition and/or laminating different phase difference plates. For example, a method of realizing a patterned λ/2 plate in a wide band by laminating two layers of liquid crystals having different twisted directions in an optically anisotropic layer is described in JP2014-089476A and the like, and the method can be preferably used in the present invention.

—Rod-Like Liquid Crystal Compound—

Preferred examples of the rod-like liquid crystal compound include azomethines, azoxys, cyanobiphenyls, cyanophenyl esters, benzoic acid esters, cyclohexanecarboxylic acid phenyl esters, cyanophenyl cyclohexanes, cyano-substituted phenyl pyrimidines, alkoxy-substituted phenyl pyrimidines, phenyl dioxanes, tolanes, and alkenyl cyclohexyl benzonitriles. Such low-molecular-weight liquid crystal molecules as well as high-molecular-weight liquid crystal molecules can also be used.

It is more preferable that the alignment of the rod-like liquid crystal compound is fixed by polymerization, and compounds described in Makromol. Chem., Vol. 190, p. 2255 (1989), Advanced Materials, Vol. 5, p. 107 (1993), U.S. Pat. Nos. 4,683,327A, 5,622,648A, 5,770,107A, WO95/22586A, WO95/24455A, WO97/00600A, WO98/23580A, WO98/52905A, JP1989-272551A (JP-H01-272551A), JP1994-016616A (JP-H06-016616A), JP1995-110469A (JP-H07-110469A), JP1999-080081A (JP-H11-080081A), and JP2001-064627 can be used as polymerizable rod-like liquid crystal compounds. Further, compounds described in JP1999-513019A (JP-H11-513019A) and JP2007-279688A can be preferably used as the rod-like liquid crystal compounds.

—Disk-Like Liquid Crystal Compound—

As the disk-like liquid crystal compound, for example, compounds described in JP2007-108732A and JP2010-244038A can be preferably used.

Figure 25:
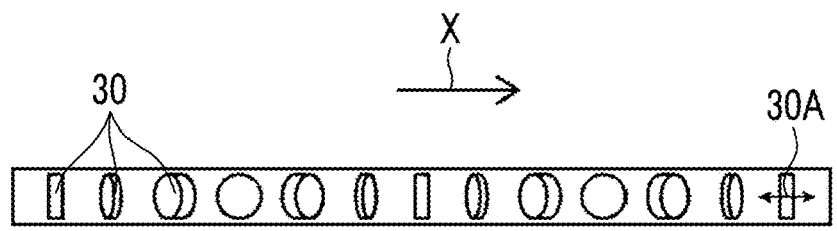
FIG. 25 is a view conceptually illustrating another example of the optically anisotropic layer.

Further, in a case where a disk-like liquid crystal compound is used in the optically anisotropic layer, the liquid crystal compound 30 rises in the thickness direction in the optically anisotropic layer, and the optical axis 30A derived from the liquid crystal compound is defined as an axis perpendicular to a disk surface, that is, a so-called fast axis (see FIG. 25).

In the liquid crystal optical element 10, the film thickness of the optically anisotropic layer 26 is not limited, but is preferably 20 μm or less, more preferably 15 μm or less, still more preferably 10 μm or less, and particularly preferably 5 μm or less from the viewpoint of reducing the thickness of the light irradiation device 100.

In the liquid crystal optical element illustrated in FIGS. 2 to 6, the optical axis 30A of the liquid crystal compound 30 in the liquid crystal alignment pattern of the optically anisotropic layer continuously rotates only along the arrow X direction.

However, the present invention is not limited thereto, and various configurations can be used as long as the optical axis 30A of the liquid crystal compound 30 continuously rotates along at least one direction in the optically anisotropic layer.

Figure 8:
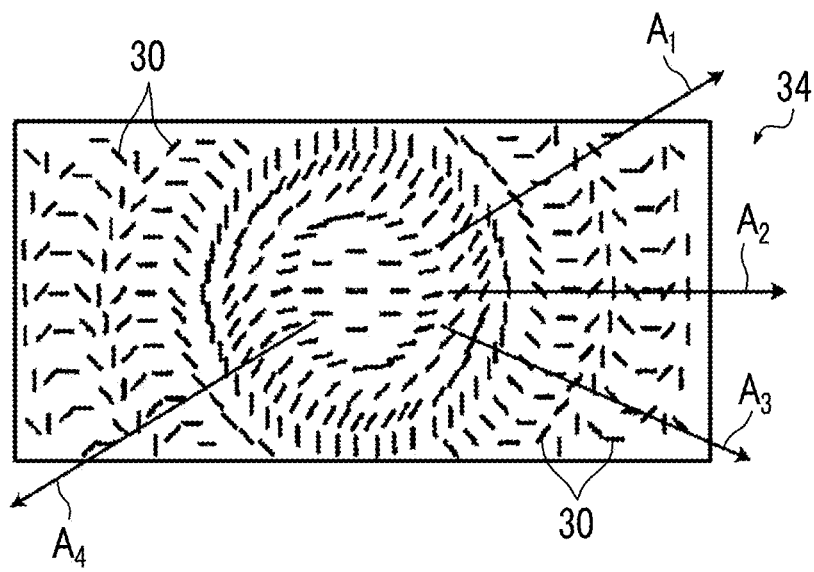
FIG. 8 is a plan view illustrating another example of the optically anisotropic layer of the liquid crystal optical element.

As an example, a liquid crystal alignment pattern as conceptually illustrated in the plan view of FIG. 8 is shown. An optically anisotropic layer 34 in which the liquid crystal alignment pattern illustrated in FIG. 8 is a concentric circular pattern in which the one directions in which the orientation of the optical axes of the liquid crystal compounds 30 continuously changes rotationally are concentric from the inside toward the outside is exemplified.

That is, the liquid crystal alignment pattern of the optically anisotropic layer 34 illustrated in FIG. 8 is a liquid crystal alignment pattern in which the one directions in which the orientation of the optical axes of the liquid crystal compounds 30 continuously changes rotationally are radially provided from the center of the optically anisotropic layer 34.

Further, FIG. 8 also illustrates only the liquid crystal compound 30 on the surface of the alignment film as in FIG. 4. As illustrated in FIG. 3, the optically anisotropic layer 34 has a structure in which the liquid crystal compounds 30 are stacked based on the liquid crystal compounds 30 on the surface of the alignment film as described above.

Further, FIG. 8 illustrates only the liquid crystal compound 30 in order to simplify the drawing. In the example illustrated in FIG. 8, the liquid crystal compound 30 is a rod-like liquid crystal compound, and the direction of the optical axis coincides with the longitudinal direction of the liquid crystal compound 30.

In the optically anisotropic layer 34, the orientation of the optical axes of the liquid crystal compounds 30 continuously changes rotationally along multiple directions from the center of the optically anisotropic layer 34 toward the outside, for example, a direction indicated by an arrow $A_1$, a direction indicated by an arrow $A_2$, a direction indicated by an arrow $A_3$, a direction indicated by an arrow $A_4$, and so on.

The absolute phase of the circularly polarized light incident on the optically anisotropic layer 34 having the liquid crystal alignment pattern changes in each local region in which the orientation of the optical axes of the liquid crystal compounds 30 varies. Here, the amount of change in absolute phase varies depending on the orientation of the optical axes of the liquid crystal compounds 30 on which the circularly polarized light is incident.

In the optically anisotropic layer 34, the rotation direction of the optical axes of the liquid crystal compounds 30 is identical in all directions (one directions). In the illustrated example, the rotation direction of the optical axes of the liquid crystal compounds 30 is counterclockwise in all the directions, such as the direction indicated by the arrow $A_1$, the direction indicated by the arrow $A_2$, the direction indicated by the arrow $A_3$, and the direction indicated by the arrow $A_4$.

That is, in a case where the arrow A₁ and the arrow A₄ are regarded as one straight line, the rotation direction of the optical axis of the liquid crystal compound 30 is reversed at the center of the optically anisotropic layer 34 on this straight line. As an example, it is assumed that the straight line formed by the arrow A₁ and the arrow A₄ is directed toward the right direction (arrow A₁ direction) in the figure. In this case, the optical axis of the liquid crystal compound 30 initially rotates clockwise from the outward direction of the optically anisotropic layer 34 toward the center, the rotation direction is reversed at the center of the optically anisotropic layer 34, and the optical axis rotates counter-clockwise toward the outward direction from the center of the optically anisotropic layer 34.

As described above, in the optically anisotropic layer (liquid crystal optical element) having a liquid crystal alignment pattern in which the orientation of the optical axes of the liquid crystal compounds 30 continuously changes rotationally in one direction, the refraction direction of light to be transmitted depends on the rotation direction of the optical axes of the liquid crystal compounds 30. That is, in a case where the rotation direction of the optical axes of the liquid crystal compounds 30 is reversed in the liquid crystal alignment pattern, the refraction direction of light to be transmitted is a direction opposite to one direction in which the optical axes rotate.

Therefore, the optically anisotropic layer 34 having such a concentric liquid crystal alignment pattern, that is, a liquid crystal alignment pattern in which the optical axes continuously rotate and change radially can transmit a plurality of incidence rays (light beams) by diverging or focusing the incidence rays according to the rotation direction of the optical axes of the liquid crystal compounds 30 and the turning direction of circularly polarized light to be incident.

That is, the liquid crystal optical element 10 exhibits a function as, for example, a convex lens or a concave lens by making the liquid crystal alignment pattern of the optically anisotropic layer concentric.

Here, in a case where the liquid crystal alignment pattern of the optically anisotropic layer is made concentric and the liquid crystal optical element is allowed to operate as a convex lens, it is preferable that the single period Λ in which the optical axis rotates by 180° in the liquid crystal alignment pattern is gradually shortened from the center of the optically anisotropic layer 34 toward one outward direction in which the optical axis continuously rotates.

As described above, the angle of refraction of light with respect to the incident direction increases as the single period Λ in the liquid crystal alignment pattern decreases. Therefore, the light focusing power of the optically anisotropic layer 34 can be further improved and the performance as a convex lens can be improved by gradually shortening the single period Λ in the liquid crystal alignment pattern from the center of the optically anisotropic layer 34 toward one outward direction in which the optical axis continuously rotates.

In a case where the liquid crystal alignment pattern of the optically anisotropic layer is made concentric and the liquid crystal optical element is allowed to operate as a concave lens, similarly, it is preferable that the single period Λ in which the optical axis rotates by 180° in the liquid crystal alignment pattern is gradually shortened by allowing the orientation in which the optical axis continuously rotates to rotate in the opposite direction from the center of the optically anisotropic layer 34 toward one outward direction.

As described above, the angle of refraction of light with respect to the incident direction increases as the single period Λ in the liquid crystal alignment pattern decreases. Therefore, the divergence power of the optically anisotropic layer 34 can be further improved and the performance as a concave lens can be improved by gradually shortening the single period Λ in the liquid crystal alignment pattern from the center of the optically anisotropic layer 34 toward one outward direction in which the optical axis continuously rotates.

In the optically anisotropic layer having a liquid crystal alignment pattern in which the orientation of the optical axes of the liquid crystal compounds 30 continuously changes rotationally in one direction, the refraction direction of transmitted light with respect to one direction in which the optical axes rotate is reversed in the turning direction of circularly polarized light to be incident.

Therefore, the liquid crystal optical element which includes the optically anisotropic layer 34 having the concentric liquid crystal alignment pattern can allow to the liquid crystal optical element to operate as a convex lens or a concave lens by selecting the turning direction of the circularly polarized light to be incident.

In the present invention, it is preferable that the following equation is satisfied in a case where the liquid crystal optical element is allowed to operate as a convex lens or a concave lens.

$$\Phi(r)=(\pi/\lambda)[(r^2+f^2)^{1/2}-f]$$

Here, r represents the distance from the center of a concentric circle and is represented by the following equation "$r=(x^2+y^2)^{1/2}$". x and y each represent the in-plane position, and "(x, y)=(0, 0)" represents the center of a concentric circle. ΦW represents the angle of the optical axis at the distance r from the center, X represents the wavelength, and f represents the target focal length.

In the present invention, conversely, the single period Λ in the concentric liquid crystal alignment pattern may be gradually increased from the center of the optically anisotropic layer 34 toward one outward direction in which the optical axis continuously rotates.

For example, in a case of providing light quantity distribution in the transmitted light, a configuration provided with regions having partially different lengths of the single period Λ in one direction in which the optical axis continuously rotates without gradually changing the single period Λ in one direction in which the optical axis continuously rotates can also be used depending on the applications of the liquid crystal optical element.

Figure 10:
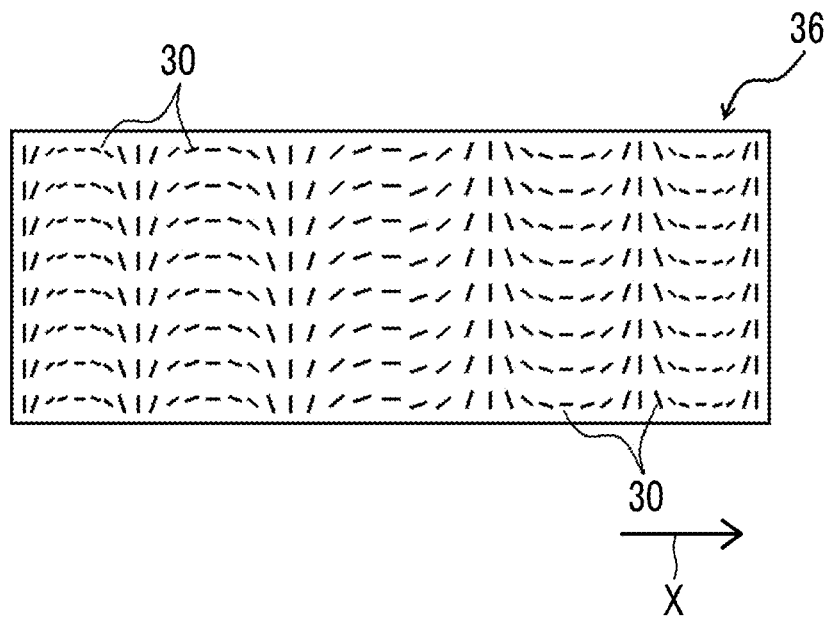
FIG. 10 is a plan view illustrating another example of the optically anisotropic layer of the liquid crystal optical element.

In addition, the liquid crystal optical element of the present invention may include an optically anisotropic layer in which the single period Λ is entirely uniform and an optically anisotropic layer having regions with different lengths of the single period Λ. Regarding this point, the same applies to the configuration in which the optical axis continuously rotates in only one direction, as illustrated in FIG. 4 and FIG. 10 described below.

Figure 9:
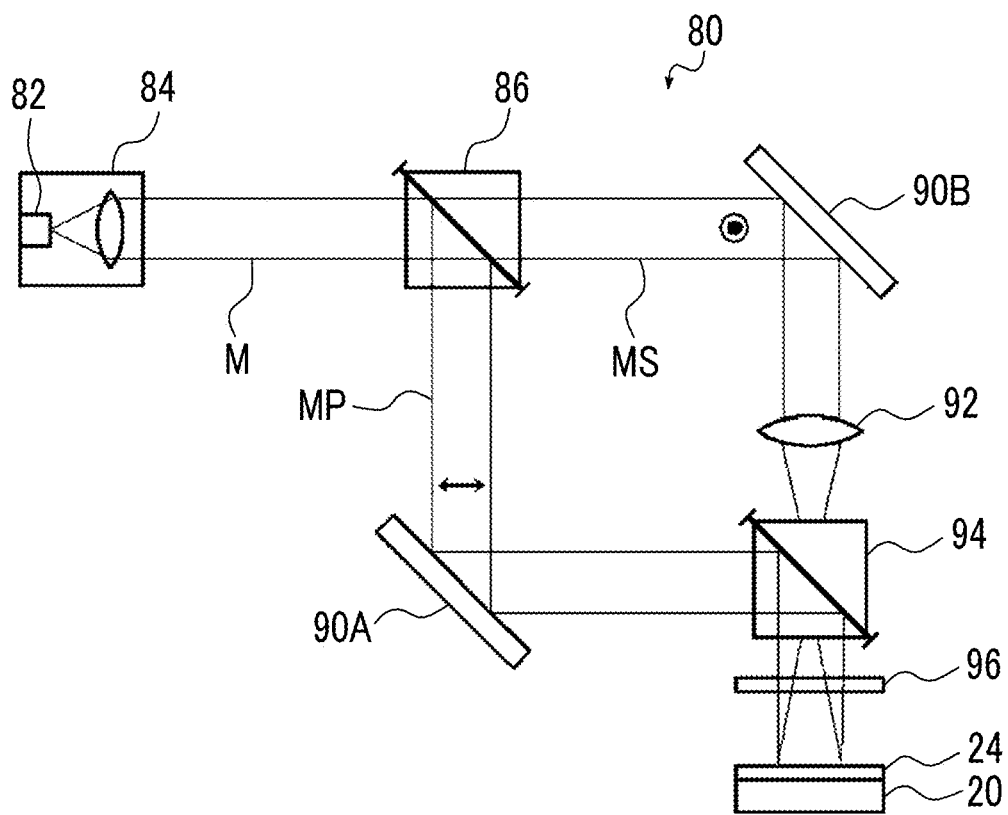
FIG. 9 is a view conceptually illustrating an example of an exposure device that exposes an alignment film forming the optically anisotropic layer illustrated in FIG. 8.

FIG. 9 conceptually illustrates an example of an exposure device that forms such a concentric alignment pattern on the alignment film 24.

An exposure device 80 includes a light source 84 comprising a laser 82, a polarized light beam splitter 86 that splits laser light M from the laser 82 into S-polarized light MS and P-polarized light MP, a minor 90A disposed on an optical path of the P-polarized light MP and a mirror 90B disposed on an optical path of the S-polarized light MS, a lens 92 disposed on the optical path of the S-polarized light MS, a polarized light beam splitter 94, and a λ/4 plate 96.

The P-polarized light MP split by the polarized light beam splitter 86 is reflected on the mirror 90A and incident on the polarized light beam splitter 94. Meanwhile, the S-polarized light MS split by the polarized light beam splitter 86 is reflected on the mirror 90B, collected by the lens 92, and incident on the polarized light beam splitter 94.

The P-polarized light MP and the S-polarized light MS are combined by the polarized light beam splitter 94 to be split into right circularly polarized light and left circularly polarized light by the λ/4 plate 96 according to the polarization direction and then are incident on the alignment film 24 on the support 20.

Here, due to the interference between the right circularly polarized light and left circularly polarized light, the polarization state of light to be applied to the alignment film 24 periodically changes in the form of interference fringes. Since the crossing angle of the left circularly polarized light and the right circularly polarized light changes toward the outside from the inside of the concentric circle, an exposure pattern in which the pitch changes toward the outside from the inside is obtained. In this manner, in the alignment film 24, a concentric alignment pattern in which the alignment state periodically changes is obtained.

In this exposure device 80, the single period Λ of the liquid crystal alignment pattern in which the optical axis of the liquid crystal compound 30 continuously rotates by 180° along one direction can be controlled by changing the refractive power of the lens 92 (F number of the lens 92), the focal length of the lens 92, the distance between the lens 92 and the alignment film 24, and the like.

Further, the length Λ of the single period of the liquid crystal alignment pattern can be changed in one direction in which the optical axis continuously rotates, by adjusting the refractive power of the lens 92 (F number of the lens 92).

Specifically, the length Λ of the single period of the liquid crystal alignment pattern can be changed in one direction in which the optical axis continuously rotates, according to the divergence angle of light spread by the lens 92 that interferes with parallel light. More specifically, in a case where the refractive power of the lens 92 is weakened, since the light is close to parallel light, the length Λ of the single period of the liquid crystal alignment pattern gradually decreases from the inside toward the outside, and the F number increases. On the contrary, in a case where the refractive power of the lens 92 increases, the length Λ of the single period of the liquid crystal alignment pattern is suddenly shortened from the inside toward the outside, and the F number decreases.

As described above, as the configuration that changes the single period Λ in which the optical axis rotates by 180° in one direction in which the optical axis continuously rotates, a configuration in which the optical axis 30A of the liquid crystal compound 30 continuously rotates and changes only in one direction of the arrow X direction as illustrated in FIGS. 2 to 6 can also be used.

For example, a liquid crystal optical element that transmits light so as to be focused only in the arrow X direction can be obtained by gradually shortening the single period Λ of the liquid crystal alignment pattern in the arrow X direction. Further, in the liquid crystal alignment pattern, a liquid crystal optical element that transmits light so as to be diverged only in the arrow X direction can be obtained by reversing the rotation direction of the optical axis 30A toward the arrow X direction.

Further, a liquid crystal optical element that transmits light so as to be diverged only in the arrow X direction can also be obtained by reversing the turning direction of the circularly polarized light to be incident.

Further, as in the case of the optically anisotropic layer 36 conceptually illustrated in the plan view of FIG. 10, the single period Λ of the liquid crystal alignment pattern and the rotation direction of the optical axis 30A may be line-symmetrically changed using the center in the arrow X direction as a center line. Further, the liquid crystal compound 30 is also a rod-like liquid crystal compound in FIG. 10, and the direction of the optical axis coincides with the longitudinal direction.

For example, the single period Λ of the liquid crystal alignment pattern is gradually shortened from the center of the arrow X direction to the arrow X direction and a direction opposite to the arrow X direction, and the rotation direction of the optical axis in the arrow X direction is reversed at the center thereof. In the illustrated example, the rotation direction of the optical axis is clockwise from the left side to the center in the figure and is counterclockwise from the center to the right side in the figure, in the arrow X direction. That is, in the example illustrated in FIG. 10, the rotation direction of the optical axis is counterclockwise both from the center to the arrow X direction and from the center to a direction opposite to the arrow X direction.

The optically anisotropic layer 36 (liquid crystal optical element) having such a liquid crystal alignment pattern exhibits a function as a lens that focuses or diverges a plurality of incidence rays symmetrically with respect to the center line in the arrow X direction.

For example, in a case of providing light quantity distribution in the transmitted light, a configuration provided with regions having partially different lengths of the single period Λ in the arrow X direction without gradually changing the single period Λ in the arrow X direction depending on the applications of the liquid crystal optical element.

Examples of the method of partially changing the single period Λ in the optically anisotropic layer include a method of disposing an optical element that partially changes the crossing angle of light beams in the exposure device 60 illustrated in FIG. 7 and the exposure device 80 illustrated in FIG. 9 and a method of scanning and exposing a photo-alignment film while optionally changing the polarization direction of focused laser light to perform patterning.

In the light irradiation device according to the embodiment of the present invention, the single period Λ in the liquid crystal alignment pattern of the optically anisotropic layer of the liquid crystal optical element is not limited and may be appropriately set according to the applications of the optical element.

<Light Emitting Element>

Figure 11:
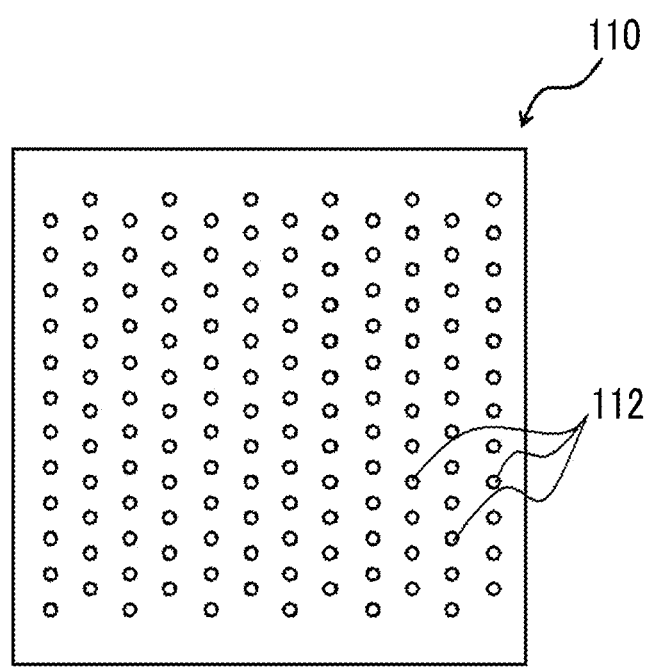
FIG. 11 is a plan view illustrating an example of a light emitting element.
Figure 12:
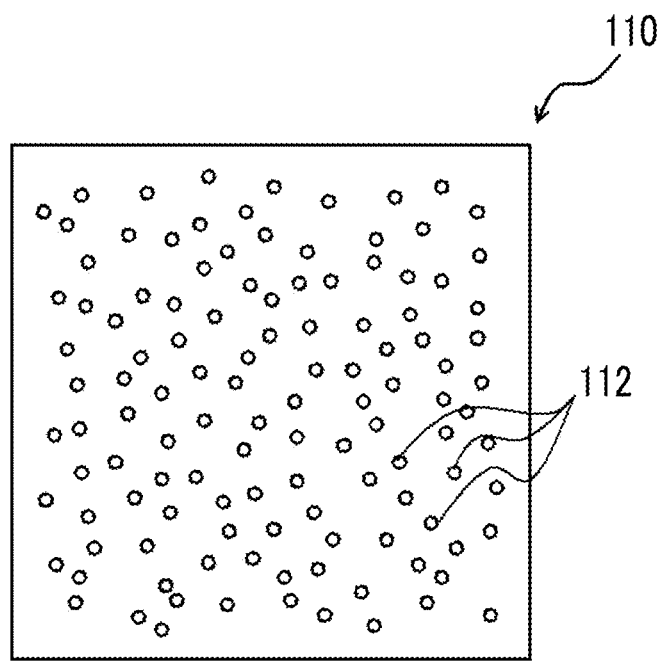
FIG. 12 is a plan view illustrating another example of the light emitting element.

FIGS. 11 and 12 each conceptually illustrate a plan view of an example of the light emitting element 110 used in the light irradiation device 100. Further, the plan view is a view illustrating the light emitting element 110 as seen from a light emitting direction of the light emitting element 110. In the light irradiation device 100, the plan view is a view illustrating the light emitting element as seen from the same direction as in the plan view of the optically anisotropic layer 26 illustrated in FIG. 4.

In the light irradiation device 100 according to the embodiment of the present invention, the light emitting element 110 includes a plurality of light emitting units 112 in the plane.

An optical pattern (light beam pattern, (light) dot pattern) formed of a plurality of light dots can be projected on an object by the light emitted from the light emitting element 110 using the light emitting element 110 including a plurality of light emitting units 112 in the plane.

A vertical-cavity surface-emitting laser (VCSEL) is suitably exemplified as an example of the light emitting element 110 including a plurality of the light emitting units 112 in the plane.

The VCSEL is known as a light source that is small in size, low in power consumption, and capable of high output.

Since the VCSEL emits light perpendicularly to a substrate, a plurality of light emitting units can be arranged in the plane of the substrate.

A photonic crystal laser is also suitably exemplified as a light emitting element which includes a plurality of light emitting units in the plane and has a small beam divergence angle of light to be emitted.

An optical pattern with a high resolution can be projected using a light emitting element which has a small beam divergence angle of light to be emitted.

The beam divergence angle of the light emitted from each light emitting unit 112 of the light emitting element 110 is not limited, but is preferably small. In a case where the beam divergence angle of the light emitted from the light emitting unit 112 is small, an optical pattern with a higher resolution can be projected as described above. The beam divergence angle of light is an angle (full width at half maximum angle) at which the radiant intensity of the emitted light is half the maximum value from the maximum radiant intensity.

The beam divergence angle of the light emitted from each light emitting unit 112 of the light emitting element 110 is preferably 20° or less, more preferably 15° or less, still more preferably 10° or less, particularly preferably 5° or less, and most preferably 3° or less.

In the light irradiation device 100 according to the embodiment of the present invention, the plurality of light emitting units 112 may be regularly arranged in the plane of the light emitting element 110 as illustrated in the plan view of FIG. 11.

Alternatively, in the light irradiation device 100 according to the embodiment of the present invention, the plurality of light emitting units 112 may be arranged irregularly in the plane of the light emitting element 110 as illustrated in the plan view of FIG. 12. By arranging the light emitting units 112 irregularly, the optical pattern to be projected is irregular. As a result, for example, it is preferable that the light irradiation device 100 according to the embodiment of the present invention is used as a sensor for shape authentication of an object from the viewpoint of improving the authentication accuracy.

In the light irradiation device 100 according to the embodiment of the present invention, the wavelength of light to be emitted from the light emitting element 110 is not limited, and the light may be visible light or invisible light. In a case where the emitted light is visible light, blue light, green light, red light, light in which a plurality of color components are mixed, or white light may be used. Further, in a case where the emitted light is invisible light, infrared light or ultraviolet light may be used.

As an example, in a case where the light irradiation device according to the embodiment of the present invention is used as a light irradiation device for a sensor, infrared rays that are unlikely to be visually recognized or cannot be visually recognized by humans are preferable as the light emitted from the light emitting element 110 of the light irradiation device 100.

In the light irradiation device 100 according to the embodiment of the present invention, the polarization state of the light emitted by the light emitting element 110 (light emitting unit 112) is not limited, but it is preferable that the light to be emitted is polarized light. Among examples of polarized light, from the viewpoint that the light incident on the liquid crystal optical element 10 (optically anisotropic layer 26) can be efficiently distributed (refracted (diffracted)), it is preferable that the light to be emitted from the light emitting element 110 is circularly polarized light.

Figure 13:
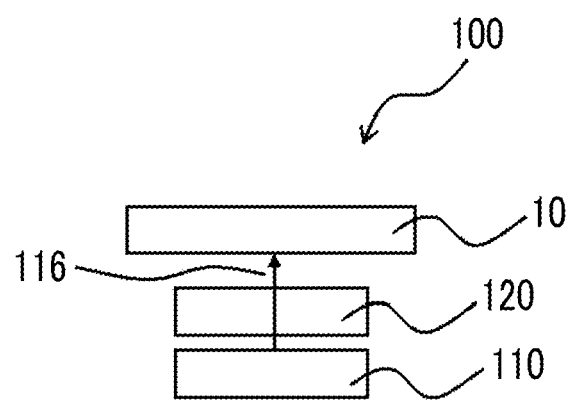
FIG. 13 is a view illustrating another example of the light irradiation device of the present invention.

In a case where the light emitted from the light emitting element 110 is linearly polarized light, a phase difference plate 120 such as a λ/4 plate is disposed between the light emitting element 110 and the liquid crystal optical element 10, as conceptually illustrated in FIG. 13. Thereby, the linearly polarized light emitted from the light emitting element 110 can be converted into circularly polarized light and can enter the liquid crystal optical element 10. In this manner, the light emitted from the light emitting element 110 can be converted into circularly polarized light and used by adjusting the phase difference of the phase difference plate 120 according to the polarization state of the light emitted from the light emitting element 110.

In the light irradiation device according to the embodiment of the present invention, the liquid crystal optical element 10 and the phase difference plate 120 and/or the phase difference plate 120 and the light emitting element 110 may be fixed by a bonding layer. As described above, in the present invention, those formed of various known materials can be used as the bonding layer as long as the layers can bond the objects to be bonded to each other. Alternatively, the light irradiation device according to the embodiment of the present invention may be configured by holding two or more of the liquid crystal optical element 10, the phase difference plate 120, and the light emitting element 110 using a frame body, a jig, or the like instead of bonding these using the bonding layer.

Figure 14:
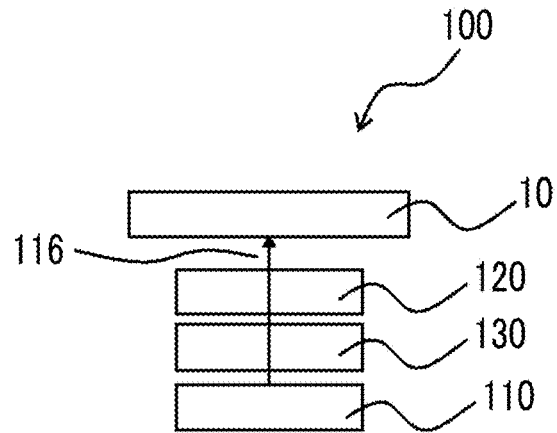
FIG. 14 is a view illustrating another example of the light irradiation device of the present invention.

In the light irradiation device according to the embodiment of the present invention, in a case where the light emitted from the light emitting element 110 is in a non-polarized state, a polarizer 130 may be further disposed between the light emitting element 110 and the phase difference plate 120 as conceptually illustrated in FIG. 14. In this manner, only the linearly polarized light component of the light emitted from the light emitting element 110 is allowed to be incident on the phase difference plate 120, and thus circularly polarized light can be allowed to be incident on the liquid crystal optical element 10.

In the light irradiation device according to the embodiment of the present invention, the liquid crystal optical element 10 and the phase difference plate 120, and/or the phase difference plate 120 and the polarizer 130, and/or the polarizer 130 and the light emitting element 110 may be fixed with a bonding layer. As described above, in the present invention, those formed of various known materials can be used as the bonding layer as long as the layers can bond the objects to be bonded to each other. Alternatively, the light irradiation device according to the embodiment of the present invention may be configured by holding two or more of the liquid crystal optical element 10, the phase difference plate 120, the polarizer 130, and the light emitting element 110 using a frame body, a jig, or the like instead of bonding these using the bonding layer.

In the light irradiation device 100 according to the embodiment of the present invention, another optical member may be disposed between the liquid crystal optical element and the light emitting element as long as the optical member maintains the function of projecting the optical pattern.

<Lens Array>

Figure 15:
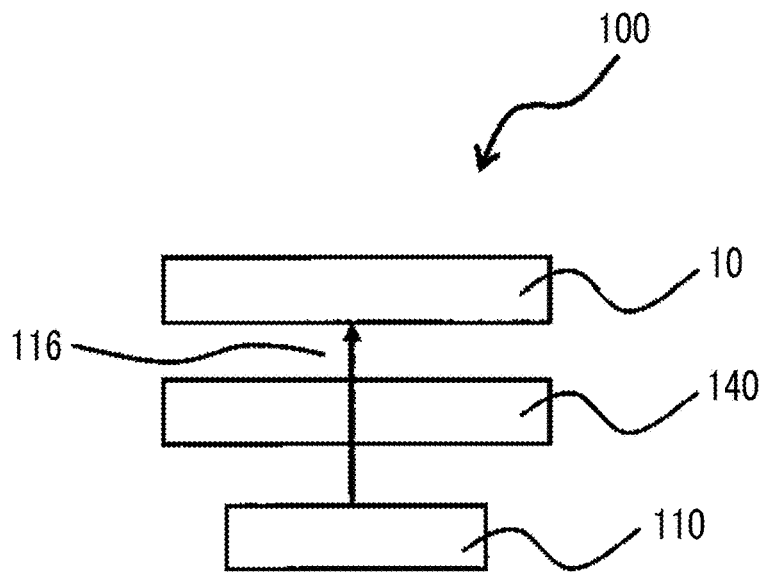
FIG. 15 is a view illustrating another example of the light irradiation device of the present invention.

As an example, in the light irradiation device 100 of the present invention, a lens array 140 in which small regions having a lens function as a convex lens are two-dimensionally arranged may be disposed between the light emitting element 110 and the liquid crystal optical element 10 as conceptually illustrated in FIG. 15.

The light emitted from the light emitting unit 112 of the light emitting element 110 has a certain beam divergence angle in many cases. Meanwhile, the beam divergence angle of the light emitted from the light emitting element 110 can be reduced so that the directivity can be enhanced by providing the lens array 140 between the light emitting element 110 and the liquid crystal optical element 10. It is preferable that the light to be incident on the liquid crystal optical element 10 can be converted into parallel light (collimated light).

As described above, an optical pattern with a high resolution can be projected by reducing the beam divergence angle of the light emitted from the light emitting element 110.

Figure 16:
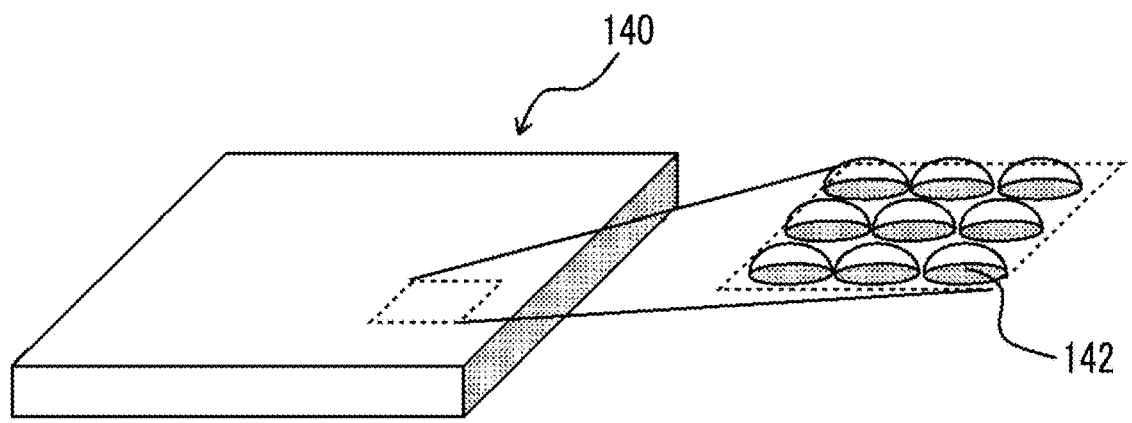
FIG. 16 is a view illustrating an example of a lens array.

As an example of the lens array 140 conceptually illustrated in FIG. 16, a lens array in which small regions 142 having a lens function as a convex lens are two-dimensionally arranged is exemplified as the lens array 140.

The small regions 142 may be arranged separately or in contact with each other. Regarding this point, the same applies to lens arrays illustrated in FIGS. 17 and 19.

As the small regions 142 of the lens array 140, various kinds can be used as long as these have a lens function.

Figure 17:
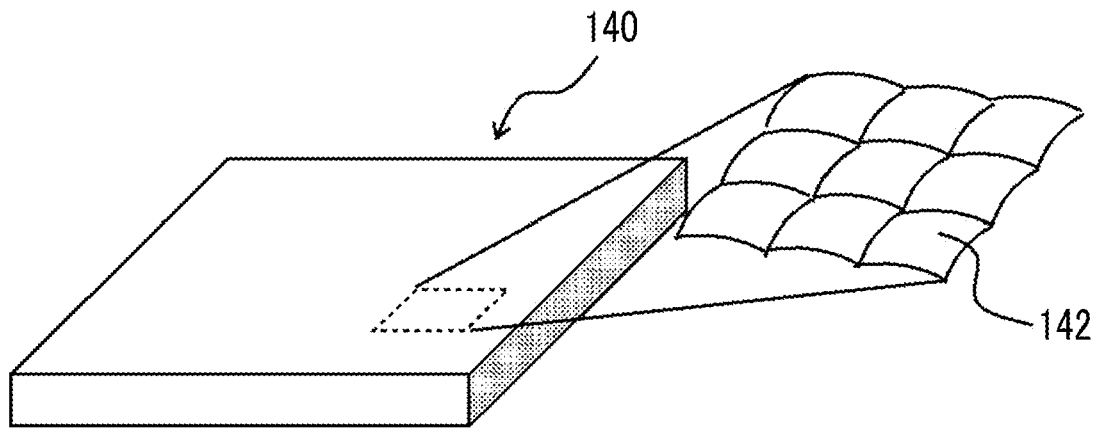
FIG. 17 is a view illustrating another example of the lens array.

For example, a partial shape of a circular lens such as a fly-eye lens may be made such that the small regions 142 are two-dimensionally arranged as in the lens array 140 illustrated in FIG. 17.

In the light irradiation device 100 according to the embodiment of the present invention, the lens array 140 may be a liquid crystal lens array in which the small regions 142 form an optically anisotropic layer formed using a liquid crystal composition containing a liquid crystal compound. It is preferable that the small regions 142 of the liquid crystal lens array also have the liquid crystal alignment pattern described above.

Figure 19:
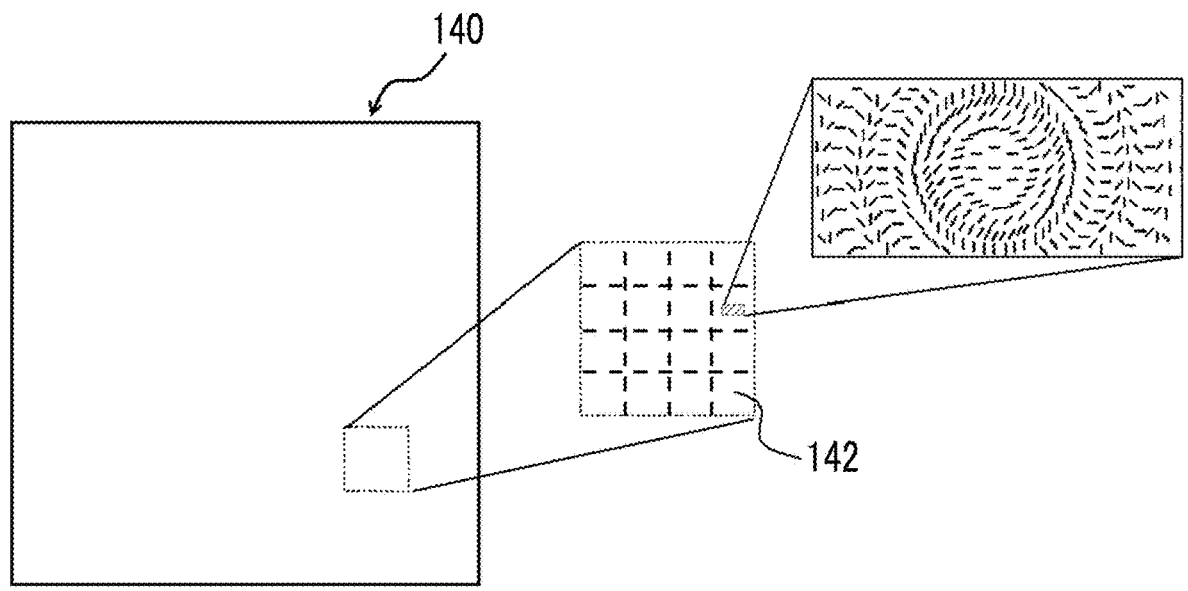
FIG. 19 is a view illustrating an example of a liquid crystal lens array.

As the liquid crystal lens array, specifically, the lens array 140 in which the small regions 142 having the same liquid crystal alignment pattern as in the optically anisotropic layer 34 illustrated in FIG. 8 described above are two-dimensionally arranged as conceptually illustrated in FIG. 19 is exemplified. That is, the small regions 142 of the liquid crystal lens array have a liquid crystal alignment pattern in which the orientation of the optical axis derived from the liquid crystal compound continuously changes rotationally along at least one in-plane direction, and the liquid crystal alignment pattern is a concentric circular pattern in which the one directions in which the orientation of the optical axis derived from the liquid crystal compound continuously changes rotationally are concentric from an inside toward an outside. As described above, the optically anisotropic layer having the concentric liquid crystal alignment pattern operates as a convex lens or a concave lens. Therefore, the small regions 142 of the liquid crystal lens array exhibit a lens function similar to that of the optically anisotropic layer 34 illustrated in FIG. 8.

It is preferable to use a liquid crystal lens array as the lens array 140 from the viewpoint of reducing the thickness of the light irradiation device 100 according to the embodiment of the present invention.

Figure 18:
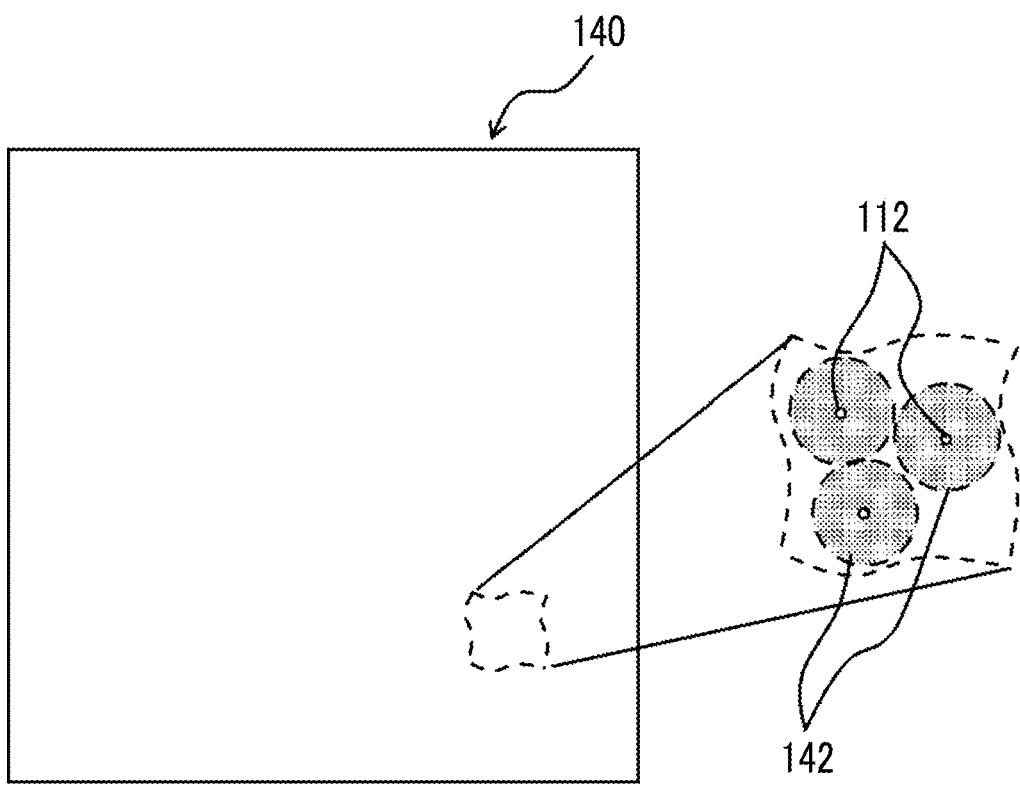
FIG. 18 is a plan view illustrating an example of disposition of the lens array and the light emitting element.

In the light irradiation device 100 according to the embodiment of the present invention, from the viewpoint of reducing the beam divergence angle of the light emitted from each light emitting unit 112 of the light emitting element 110, it is preferable that one small region 142 in the lens array 140 couples to one light emitting unit 112 of the light emitting element 110 as conceptually illustrated in the plan view of FIG. 18. That is, in the light irradiation device 100 according to the embodiment of the present invention which has the lens array 140, it is preferable that one light emitting unit 112 of the light emitting element 110 is disposed in the plane of one small region 142 in the lens array 140.

Further, from the viewpoint of reducing the beam divergence angle, in the surface direction of the lens array 140, it is preferable that the small regions 142 of the lens array 140 are arranged such that the focal position of each small region 142 of the lens array 140 and the light emitting unit 112 of the light emitting element 110 coincide with each other in the surface direction of the lens array 140. The surface direction of the lens array 140 is the in-plane direction of the light emitting element 110, that is, the arrangement direction of the light emitting units 112.

Therefore, in a case where the light emitting units 112 of the light emitting element 110 are arranged irregularly, it is preferable that the small regions 142 of the lens array 140 are also arranged irregularly.

<Diffractive Optical Element>

Figure 20:
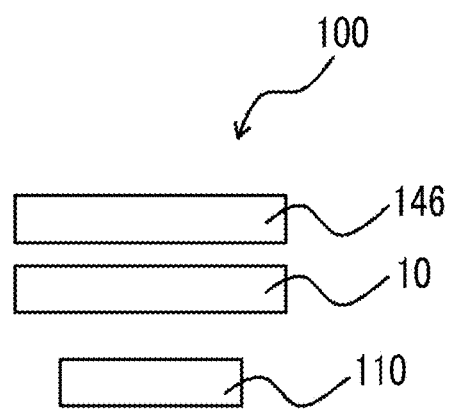
FIG. 20 is a view illustrating another example of the light irradiation device of the present invention.

As an example, the light irradiation device 100 according to the embodiment of the present invention may include the light emitting element 110, the liquid crystal optical element 10, and a diffractive optical element 146 in this order, as illustrated in FIG. 20.

The diffractive optical element 146 is used for duplicating and projecting an optical pattern formed of a plurality of light beams emitted from the light emitting element 110 and transmitted through the liquid crystal optical element 10 in different emission directions, in a wider angle region. In other words, the diffractive optical element 146 is used for dividing one light (one light beam) in an optical pattern formed of a plurality of light beams emitted from the light emitting element 110 so that the optical pattern is duplicated, arranged, and projected in a wider angle region.

The duplication and projection of optical patterns are widely used as optical three-dimensional mapping.

Such a mapping is produced by treating an optical image of a three-dimensional shape of a surface of one object. The desired characteristics of the projected optical pattern usually depend on the applications thereof, but typically consist of high contrast, high projection efficiency, and high uniformity of the intensity distribution between luminous fluxes constituting the optical pattern.

In a case where the uniformity of the projection method is low, since the accuracy of the treatment performed on an optical image is decreased, it is desirable to increase the uniformity. Therefore, a diffractive optical element is frequently used.

However, the diffractive optical element has a so-called 0-order problem. A 0-order light beam is a part of incidence rays and is a light beam that is not diffracted by projection and thus passes through an optical system to reach a projection space and has high intensity. In order to reduce the influence of the 0-order light beam, for example, U.S. Pat. No. 6,560,019B describes a diffractive optical element including a first lattice and a second lattice. Further, US2007/0019909A describes an image display device having a diffractive optical element and a first surface provided at a position where a 0-order light beam output from the diffractive optical element is not incident. Further, JP2014-209237A describes a method of dispersing the intensities of 0-order light beams using a plurality of diffraction elements to obtain a high uniformity of intensity distribution. In addition to the description above, improvement of the method of projecting an optical pattern is required.

In the light irradiation device 100 according to the embodiment of the present invention, it is preferable that the diffractive optical element 146 is configured using a liquid crystal diffraction element. The liquid crystal diffraction element has an optically anisotropic layer formed using a liquid crystal composition containing a liquid crystal compound, similar to the liquid crystal optical element 10 described above. Further, similarly, it is preferable that the optically anisotropic layer has a liquid crystal alignment pattern in which the orientation of the optical axes derived from the liquid crystal compounds continuously changes rotationally along at least one in-plane direction.

In the light irradiation device 100 according to the embodiment of the present invention, the intensities of a 0-order light beam and ±1-order light beams can be optionally controlled by using such a liquid crystal diffraction element as the diffractive optical element 146, and thus high uniformity of intensity distribution is obtained.

Further, since the angles of the ±1-order light beams can be controlled by stacking liquid crystal diffraction elements having different lengths of the single period Λ, a wide space can be efficiently covered with light with uniform intensity such that the duplicated and projected patterns do not overlap each other. As described above, the single period Λ is the length of the single period in which the optical axis derived from the liquid crystal compound rotates by 180° in the liquid crystal alignment pattern.

The liquid crystal diffraction elements may be stacked by allowing one direction (the arrow X direction in FIGS. 2 to 6) in which the optical axes derived from the liquid crystal compounds rotate to be parallel, may be stacked by being orthogonal to each other, or may be stacked so as to intersect with each other obliquely. That is, in the light irradiation device according to the embodiment of the present invention, the diffractive optical element 146 may include a plurality of diffraction elements having different diffraction directions.

With these combinations, a wide region of the three-dimensional space can be covered with the optical pattern.

Further, in the present invention, in a case where the diffractive optical element 146 includes a liquid crystal diffraction element, it is preferable that the diffractive optical element 146 includes a phase difference plate in addition to the liquid crystal diffraction element.

In a case where the diffractive optical element 146 includes a plurality of liquid crystal diffraction elements in a state of being stacked on each other, it is preferable that a phase difference plate is provided between the liquid crystal diffraction elements. Further, in the case where the diffractive optical element 146 includes a plurality of liquid crystal diffraction elements in a state of being stacked on each other, it is also preferable that one phase difference plate is used in combination with one liquid crystal diffraction element.

The phase difference plate converts the diffracted circularly polarized light into light in another polarization state. In this manner, ±1-order light beams can be allowed to have the same intensity in a case where the light that has passed through the phase difference plate is incident on the liquid crystal diffraction element provided downstream. In the present invention, the upstream and downstream each indicate upstream and downstream in the traveling direction of the light emitted from the light emitting element 110 unless otherwise specified.

The phase difference plate is not limited and may be appropriately selected according to the optical anisotropy of the liquid crystal diffraction element, but a λ/4 plate is preferable. At this time, since the circularly polarized light is converted into linearly polarized light, the ±1-order light beams of the liquid crystal diffracted light from the linearly polarized light expressed by superposition of left and right polarized light can be allowed to have the same intensity, and the light intensity can be made uniform.

As described above, the liquid crystal diffraction element has the optically anisotropic layer. In the optically anisotropic layer, the angle at which the transmitted light is refracted can be controlled by the length of the single period Λ of the liquid crystal alignment pattern as described above.

Further, the angle at which the transmitted light is refracted can be changed in the plane in a case where the optically anisotropic layer has regions with different lengths of the single period Λ of the liquid crystal alignment pattern as described above.

In the light irradiation device 100 according to the embodiment of the present invention, the diffractive optical element 146 that splits light is not limited to those using the liquid crystal diffraction element.

That is, in the present invention, various known diffractive optical elements (DOE) used for projecting an optical pattern, such as a diffractive optical element using a surface relief and a diffractive optical element using a diffractive hologram can be used as the diffractive optical element 146. Further, various commercially available products may be used as the diffractive optical element 146.

<Operation of Light Irradiation Device>

The light irradiation device 100 according to the embodiment of the present invention includes the light emitting element 110 including a plurality of light emitting units 112 in the plane and the liquid crystal optical element 10.

Further, the liquid crystal optical element 10 includes the optically anisotropic layer 26 formed using a liquid crystal composition containing a liquid crystal compound. In the present invention, the optically anisotropic layer 26 of the liquid crystal optical element 10 has a liquid crystal alignment pattern in which the orientation of the optical axes 30A derived from the liquid crystal compounds 30 continuously changes rotationally along at least one in-plane direction and has regions with different lengths of the single period Λ in the liquid crystal alignment pattern in the plane. The single period Λ is the length of the single period in which the optical axis 30A derived from the liquid crystal compound 30 rotates by 180° in the liquid crystal alignment pattern (see FIG. 4).

Such a light irradiation device 100 according to the embodiment of the present invention is capable of reducing the thickness of the device and projecting a desired optical pattern on a target object.

Hereinafter, the operation of the light irradiation device 100 according to the embodiment of the present invention will be described in detail with reference to the conceptual views of FIGS. 21A to 23.

In FIGS. 21A to 23, the respective members constituting the light irradiation device 100 are illustrated in a state of being separated from each other in the light traveling direction, but the respective members may be laminated and fixed by a bonding layer or the like as described above.

Figure 21A:
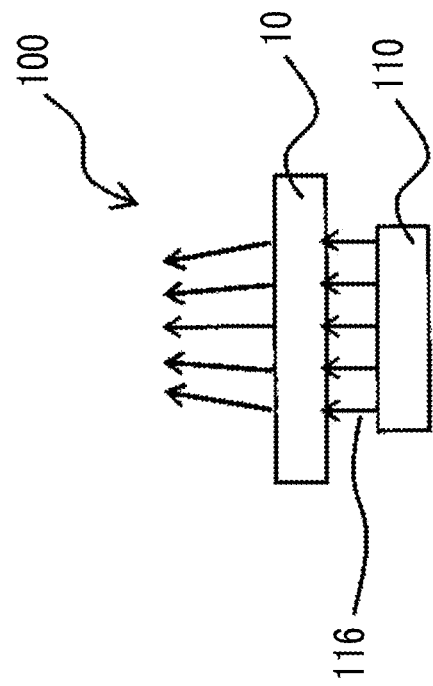
FIGS. 21A and 21B is a conceptual view illustrating the operation of the light irradiation device of the present invention.
Figure 21B:
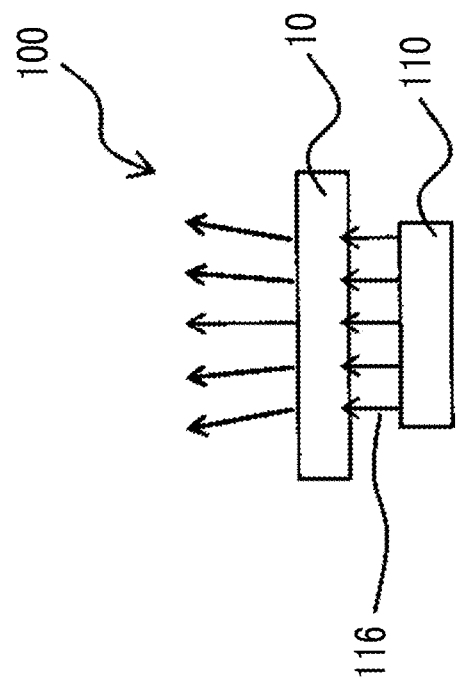

The light irradiation device 100 illustrated in FIGS. 21A and 21B includes the liquid crystal optical element 10 and the light emitting element 110.

The light emitting element 110 emits light 116 from a plurality of light emitting units 112 arranged at different positions in the plane.

The light 116 emitted from the light emitting element 110 is incident on the liquid crystal optical element 10. As described above, the liquid crystal optical element 10 has an optically anisotropic layer. The optically anisotropic layer has a liquid crystal alignment pattern in which the optical axis derived from the liquid crystal compound continuously rotates in at least one direction. As described above, such an optically anisotropic layer refracts the circularly polarized light which has been incident in one direction in which the optical axis rotates and transmits the light. Therefore, the light 116 which has been incident on the liquid crystal optical element 10 changes the traveling direction according to the incident position in the plane of the liquid crystal optical element 10 and is transmitted through the liquid crystal optical element 10.

In this manner, a desired optical pattern can be projected on an object by distributing the lights 116 emitted from different positions in the plane of the light emitting element 110 into light beams traveling in different directions.

Further, the light irradiation device 100 according to the embodiment of the present invention has a configuration in which the liquid crystal optical element 10 including a support, an alignment film, and an optically anisotropic layer is simply combined with the light emitting element 110, and thus the thickness of the device can be significantly reduced as compared with a light irradiation device of the related art that projects an optical pattern as described in US2014/0376092A and JP2018-500589A.

As described above, in the optically anisotropic layer having the liquid crystal alignment pattern, the refraction direction of light is reversed depending on the turning direction of the circular direction and the rotation direction of the optical axis toward one direction. Therefore, in the light irradiation device 100 according to the embodiment of the present invention, as an example, a plurality of light (light beams) 116 transmitted through the liquid crystal optical element 10 may be diverged toward the outward direction as illustrated in FIG. 21A or focused as illustrated in FIG. 21B.

Further, in the light irradiation device 100 according to the embodiment of the present invention, the plurality of light beams transmitted through the liquid crystal optical element 10 may travel in irregular directions.

In the light irradiation device 100 according to the embodiment of the present invention, the optically anisotropic layer of the liquid crystal optical element 10 has regions with different lengths of the single period $\Lambda$ in the liquid crystal alignment pattern in the plane. As described above, the refraction angle of light emitted from the liquid crystal optical element 10 can be increased by shortening the single period $\Lambda$ in the liquid crystal alignment pattern.

For example, in a case where the liquid crystal optical element 10 includes the optically anisotropic layer 34 having a concentric liquid crystal alignment pattern as illustrated in FIG. 8, the single period $\Lambda$ is gradually shortened from the center toward the outward direction in one direction in which the optical axis derived from the liquid crystal compound rotates (the arrow $A_1$ direction, the arrow $A_2$ direction, and so on).

In this manner, the refraction of the light 116 which has been incident is small in the central portion and gradually increases from the center toward the outward direction in the surface direction of the liquid crystal optical element 10 (optically anisotropic layer 34). That is, in this configuration, the light which has been incident on the optically anisotropic layer 34 travels along an optical path closer to the incident direction at the central portion and travels along an optical path having a larger inclination with respect to the incident direction as the light goes to the peripheral portion.

Therefore, in this case, a plurality of light beams (optical paths of the plurality of light beams) which have been incident on the liquid crystal optical element 10 are largely diverged toward the outward direction so that the projection regions of the optical pattern can be widened by setting the liquid crystal optical element 10 to refract the light 116 in the outward direction according to the rotation direction of the optical axis in one direction and the turning direction of circularly polarized light to be incident.

In the light irradiation device 100 according to the embodiment of the present invention, in a case of considering that the light emitted from the light emitting element 110 is distributed in different directions and the optical pattern is projected, the optically anisotropic layer of the liquid crystal optical element 10 has a region in which the single period $\Lambda$ in the liquid crystal alignment pattern is preferably 100 µm or less, more preferably 50 µm or less, and still more preferably 30 µm or less.

In consideration of the accuracy of the liquid crystal alignment pattern, the single period $\Lambda$ in the liquid crystal alignment pattern of the optically anisotropic layer is preferably 0.1 µm or greater.

Figure 22:
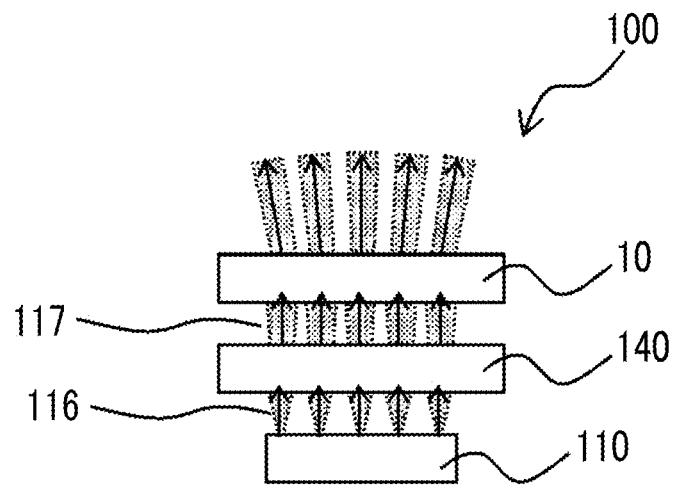
FIG. 22 is a conceptual view illustrating the operation of the light irradiation device of the present invention.

FIG. 22 illustrates another example of the light irradiation device according to the embodiment of the present invention.

The light irradiation device 100 illustrated in FIG. 22 further includes a lens array 140 between the light emitting element 110 and the liquid crystal optical element 10. As described above, the lens array 140 is obtained by two-dimensionally arranging small regions having a lens function (see FIG. 16 and the like).

Since the light irradiation device 100 includes the lens array 140, the beam divergence angle of the light 116 emitted from the light emitting element 110 can be reduced.

The light 116 emitted from a plurality of light emitting units arranged at different positions in the plane of the light emitting element 110 is converted into light 117 having high directivity by being transmitted through the lens array 140 and then is incident on the liquid crystal optical element 10. The plurality of light beams 117 which have been incident on the liquid crystal optical element 10 change the traveling direction according to the incident position in the plane of the liquid crystal optical element 10, are transmitted through the liquid crystal optical element 10, and are distributed to light beams that travel in mutually different directions. In this manner, an optical pattern having a high resolution can be projected by reducing the beam divergence angle of the light which has been incident on the liquid crystal optical element 10 and improving the directivity.

Figure 23:
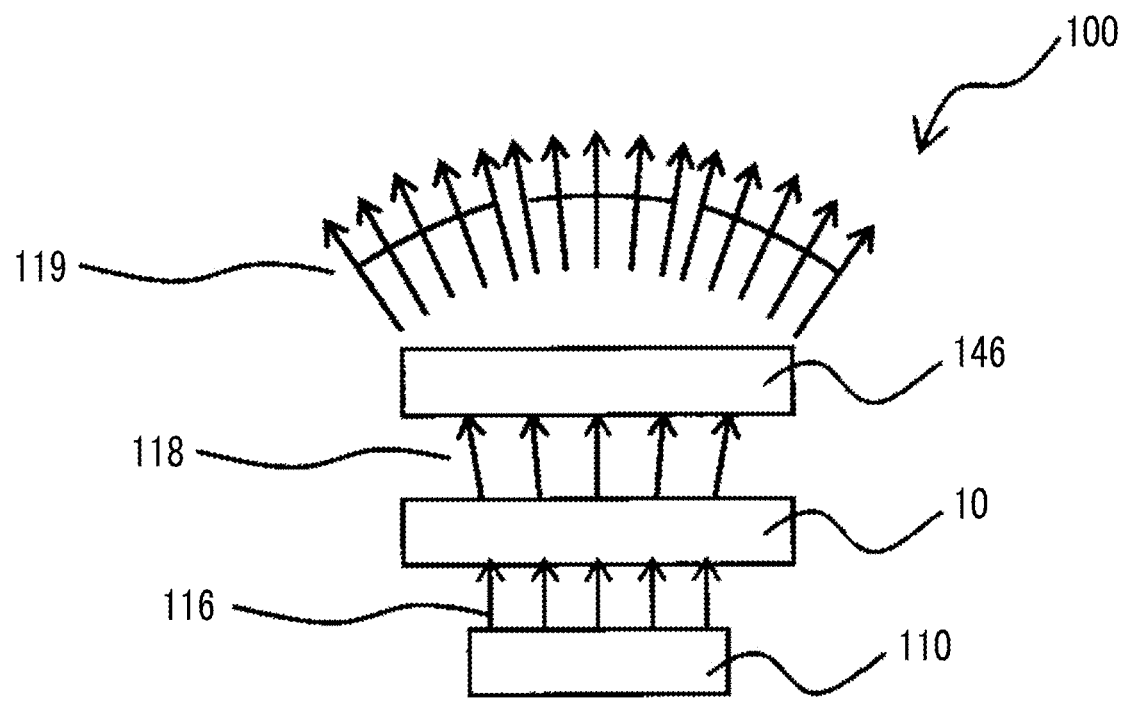
FIG. 23 is a conceptual view illustrating the operation of the light irradiation device of the present invention.

FIG. 23 illustrates another example of the light irradiation device according to the embodiment of the present invention.

The light irradiation device 100 illustrated in FIG. 23 further includes a diffractive optical element 146 downstream of the liquid crystal optical element 10. As described above, the diffractive optical element 146 splits each light in the optical pattern formed of a plurality of light beams to duplicate the optical pattern and project the optical pattern on a region with a wider angle.

In the light irradiation device 100 illustrated in FIG. 23, the light 116 emitted from the light emitting unit of the light emitting element 110 is incident on the liquid crystal optical element 10, changes the traveling direction according to the incident position in the plane of the liquid crystal optical element 10, is transmitted through the liquid crystal optical element 10, and is distributed to light beams traveling in mutually different directions. In a case where the distributed light beams are incident on the diffractive optical element 146, respective light beams are split, that is, the optical pattern of the light 116 emitted from the light emitting element 110 is duplicated and projected.

Since the light irradiation device 100 according to the embodiment of the present invention comprises the diffractive optical element 146, the light 118 (optical pattern) transmitted through the liquid crystal optical element 10 can be projected as light 119 (optical pattern) duplicated in a region with a wider angle.

Further, the light irradiation device 100 according to the embodiment of the present invention is not limited to the configuration provided with only one of the lens array 140 and the diffractive optical element 146 and may have both the lens array 140 and the diffractive optical element 146.

Second Embodiment of Light Irradiation Device

Figure 26:
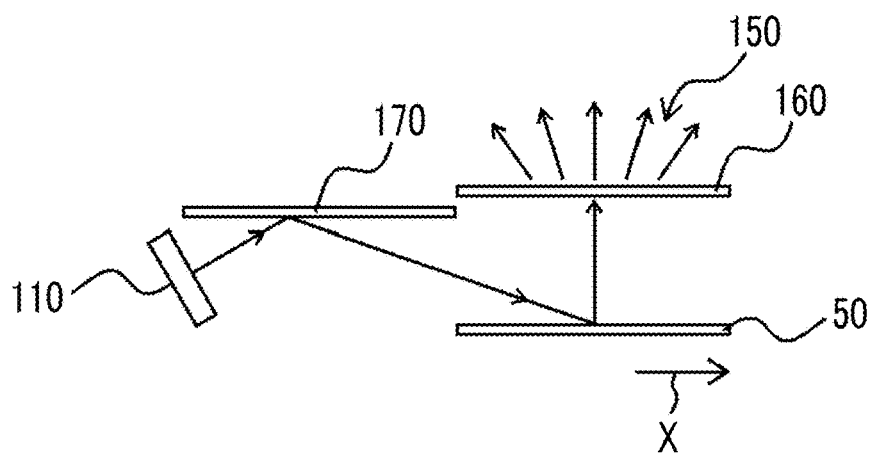
FIG. 26 is a view illustrating another example of the light irradiation device of the present invention.

FIG. 26 conceptually illustrates an example of a light irradiation device according to a second embodiment of the present invention.

A light irradiation device 150 according to the second embodiment of the present invention illustrated in FIG. 26 includes the light emitting element 110, a reflective element 170, a liquid crystal optical element 50, and a lens element 160.

In the light irradiation device 150 according to the second embodiment of the present invention, the liquid crystal optical element 50 includes an optically anisotropic layer formed using a liquid crystal composition containing a liquid crystal compound, similarly to the liquid crystal optical element 10 described above.

Further, the optically anisotropic layer of the liquid crystal optical element 50 also has the same liquid crystal alignment pattern as that of the optically anisotropic layer 26 of the liquid crystal optical element 10 described above. That is, the optically anisotropic layer of the liquid crystal optical element 50 also has a liquid crystal alignment pattern in which the optical axis derived from the liquid crystal compound continuously rotates in at least one direction. Further, the optically anisotropic layer of the liquid crystal optical element 50 also has regions having different lengths of the single period Λ in the liquid crystal alignment pattern. The single period Λ is the length of the single period in which the optical axis 30A derived from the liquid crystal compound 30 rotates by 180° in the liquid crystal alignment pattern (see FIG. 4).

Here, in the light irradiation device 100 according to the first embodiment of the present invention described above, the liquid crystal optical element 10 transmits light and refracts the transmitted light so that a plurality of incidence rays (optical paths of a plurality of light beams) are diverged or focused.

Meanwhile, in the light irradiation device 150 according to the second embodiment of the present invention, the optically anisotropic layer of the liquid crystal optical element 50 is a cholesteric liquid crystal layer formed by fixing a cholesteric liquid crystal phase. Therefore, the liquid crystal optical element 50 of the light irradiation device 150 selectively reflects circularly polarized light in a specific turning direction in the specific wavelength range.

Figure 30:
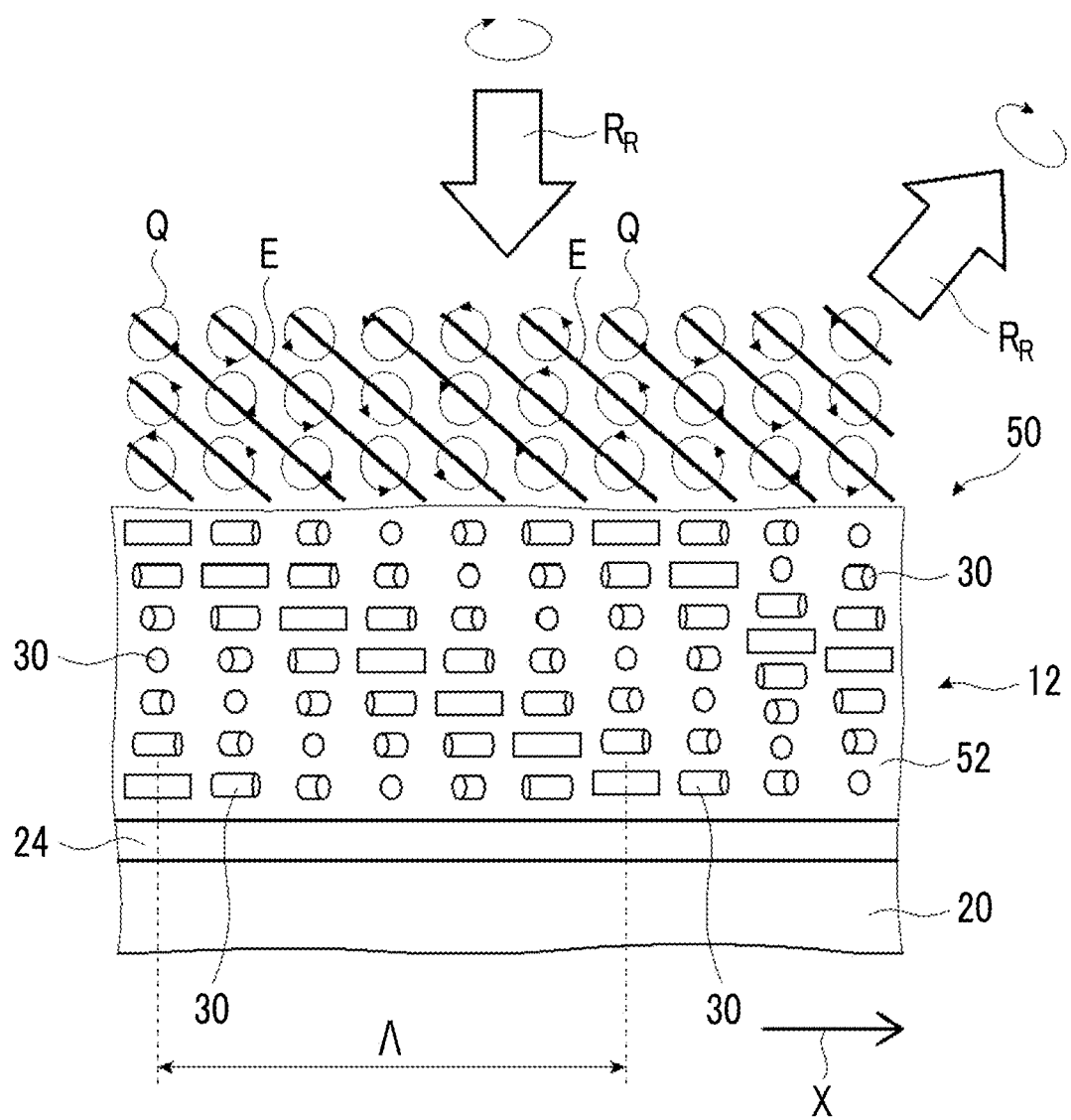
FIG. 30 is a conceptual view for describing the operation of a cholesteric liquid crystal layer.

FIG. 30 conceptually illustrates the configuration of the liquid crystal optical element 50 of the light irradiation device 150.

The liquid crystal optical element 50 includes a support 20, an alignment film 24, and a cholesteric liquid crystal layer 52 as an optically anisotropic layer. The support 20 and the alignment film 24 are the same as those of the liquid crystal optical element 10 described above.

<Cholesteric Liquid Crystal Layer>

The cholesteric liquid crystal layer 52 has a spiral structure in which the liquid crystal compounds 30 spirally turn in the thickness direction and are stacked on each other and has a structure in which the liquid crystal compounds 30 turning spirally are laminated in a plurality of pitches in a case where a configuration in which the liquid crystal compounds 30 spirally rotate once (rotate 360°) and are stacked on each other is set as one spiral pitch.

It is known that the cholesteric liquid crystal phase exhibits selective reflectivity at a specific wavelength. The central wavelength of selective reflection (selective reflection central wavelength) λ depends on a pitch P(=spiral period) of the spiral structure in the cholesteric liquid crystal phase and follows the relationship of λ=n×P and an average refractive index n of the cholesteric liquid crystal phase. Therefore, the selective reflection central wavelength can be adjusted by adjusting the pitch of this spiral structure. The pitch of the cholesteric liquid crystal phase depends on the kind of the chiral agent used together with the liquid crystal compound in a case of forming the cholesteric liquid crystal layer or the addition concentration thereof, and thus a desired pitch can be obtained by adjusting these.

Further, the adjustment of the pitch is described in detail in Fujifilm Research Report No. 50 (2005), p. 60 to 63. As the method of measuring the sense and pitch of the spiral, the methods described in "Introduction to Liquid Crystal Chemistry Experiments" (edited by Japanese Liquid Crystal Society, Sigma Publishing Co., Ltd, 2007, p. 46) and "Liquid Crystal Handbook" (Liquid Crystal Handbook Editorial Committee, Maruzen, p. 196) can be used.

The cholesteric liquid crystal phase exhibits selective reflectivity for any of left circularly polarized light and right circularly polarized light at a specific wavelength. Whether the reflected light is right circularly polarized light or left circularly polarized light depends on the spiral twist direction (sense) of the cholesteric liquid crystal phase. In the selective reflection of circularly polarized light by the cholesteric liquid crystal phase, right circularly polarized light is reflected in a case where the spiral twist direction of the cholesteric liquid crystal phase is right, and left circularly polarized light is reflected in a case where the spiral twist direction is left.

Further, the turning direction of the cholesteric liquid crystal phase can be adjusted according to the kind of the liquid crystal compound forming the cholesteric liquid crystal layer and/or the kind of the chiral agent to be added.

Further, a half-width Δλ (nm) of a selective reflection band (circularly polarized light reflection band) showing the selective reflection depends on the half-width Δn of the cholesteric liquid crystal phase and the pitch P of the spiral and follows the relationship of "Δλ=Δn×P". Therefore, the width of the selective reflection band can be controlled by adjusting the half-width Δn. The half-width Δn can be adjusted according to the kind of the liquid crystal compound forming the cholesteric liquid crystal layer, the mixing ratio thereof, and the temperature at the time of fixing the alignment.

The half-width of the reflection wavelength region is adjusted according to the applications of the light irradiation device 150 and may be in a range of, for example, 10 to 500 nm, preferably in a range of 20 to 300 nm, and more preferably in a range of 30 to 100 nm.

The thickness of the cholesteric liquid crystal layer 52 is not limited, and the thickness at which the required light reflectivity is obtained may be set appropriately according to the applications of the light irradiation device 150, the reflectivity of light required for the liquid crystal optical element 50 (cholesteric liquid crystal layer 52), and the material for forming the cholesteric liquid crystal layer.

As illustrated in FIG. 4, the cholesteric liquid crystal layer 52 has a liquid crystal alignment pattern in which the optical axis of the liquid crystal compound 30 continuously changes rotationally along the arrow X direction (predetermined one direction) in the plane. In FIG. 30, the liquid crystal compound 30 is a rod-like liquid crystal compound, and the optical axis thereof coincides with the longitudinal direction of the liquid crystal compound 30.

The cholesteric liquid crystal layer obtained by fixing a cholesteric liquid crystal phase usually specularly reflects light which has been incident (circularly polarized light).

Meanwhile, the cholesteric liquid crystal layer 52 having the liquid crystal alignment pattern described above reflects the light which has been incident in a direction having an angle in the arrow X direction with respect to the specular reflection. For example, the cholesteric liquid crystal layer 52 does not reflect the light, which has been incident from the normal direction, in the normal direction, but reflects the light by inclining the light to the arrow X with respect to the normal direction. The light incident from the normal direction is light incident from the front surface, that is, light incident perpendicular to the main surface. The main surface is the maximum surface of the cholesteric liquid crystal layer 52.

As an example, a cholesteric liquid crystal layer that selectively reflects right circularly polarized light will be described.

In a case where the right circularly polarized light which has been incident on the cholesteric liquid crystal layer 52 is reflected by the cholesteric liquid crystal layer 52, the absolute phase thereof changes according to the orientation of the optical axis of each liquid crystal compound 30.

Here, in the cholesteric liquid crystal layer 52, the optical axis of the liquid crystal compound 30 changes rotationally along the arrow X direction (one direction). Therefore, the amount of change in the absolute phase of the right circularly polarized light which has been incident varies depending on the orientation of the optical axis.

Further, the liquid crystal alignment pattern formed on the cholesteric liquid crystal layer 52 is a periodic pattern in the arrow X direction. Therefore, a periodic absolute phase Q is imparted to the right circularly polarized light which has been incident on the cholesteric liquid crystal layer 52 in the arrow X direction corresponding to the orientation of each optical axis.

Further, the orientation of the optical axes of the liquid crystal compounds 30 with respect to the arrow X direction is uniform in the arrangement of the liquid crystal compounds 30 in the Y direction orthogonal to the arrow X direction (see FIG. 4).

In this manner, an equiphase surface E inclined in the arrow X direction with respect to the XY plane is formed in the cholesteric liquid crystal layer 52 for the right circularly polarized light.

Therefore, the right circularly polarized light is reflected in the normal direction of the equiphase surface E (the direction orthogonal to the equiphase surface E), and the reflected right circularly polarized light is reflected in a direction inclined in the arrow X direction with respect to the XY plane (the main surface of the cholesteric liquid crystal layer 52).

Even in the cholesteric liquid crystal layer 52, the angle of the reflected light with respect to the incidence ray varies depending on the single period Λ. Specifically, the angle of the reflected light with respect to the incidence ray increases as compared with the specular reflection as the single period Λ decreases.

Therefore, the cholesteric liquid crystal layer 52, that is, the optically anisotropic layer of the liquid crystal optical element 50 has regions with different lengths of the single period Λ in the plane, and thus the light which has been incident can be reflected at different angles according to the incident positions in the cholesteric liquid crystal layer 52.

As an example, the cholesteric liquid crystal layer 52 can be formed in the same manner as described above, using a liquid crystal composition to which a chiral agent has been added as the liquid crystal composition for forming the optically anisotropic layer 26 of the liquid crystal optical element 10 described above.

Further, in a case of forming the cholesteric liquid crystal layer 52, the cholesteric liquid crystal layer is formed by applying the liquid crystal composition, drying and/or heating the composition as necessary, and then curing the composition. In this drying and/or heating step, the liquid crystal compound in the liquid crystal composition may be aligned in the cholesteric liquid crystal phase.

——Chiral Agent (Optically Active Compound)——

The chiral agent (chiral agent) has a function of inducing a spiral structure of a cholesteric liquid crystal phase. The chiral agent may be selected depending on the purpose thereof because the spiral twist direction or the spiral pitch induced by a compound varies.

The chiral agent is not particularly limited, and known compounds (for example, Liquid Crystal Device Handbook, section 4-3 in Chapter 3, chiral agent for twisted nematic (TN) and super twisted nematic (STN), p. 199, edited by Japan Society for the Promotion of Science, 142th Committee, 1989), isosorbide, isomannide derivatives, and the like can be used.

The chiral agent typically contains asymmetric carbon atoms, but an axially asymmetric compound or planarly asymmetric compound that does not contain asymmetric carbon atoms can also be used as a chiral agent. Examples of the axially asymmetric compound and the planarly asymmetric compound include binaphthyl, helicene, paracyclophane, and derivatives thereof. The chiral agent may contain a polymerizable group. In a case where both the chiral agent and the liquid crystal compound contain a polymerizable group, a polymer having a repeating unit derived from a polymerizable liquid crystal compound and a repeating unit derived from a chiral agent can be formed by the polymerization reaction between the polymerizable chiral agent and the polymerizable liquid crystal compound. In this embodiment, it is preferable that the polymerizable group contained in the polymerizable chiral agent is the same group as the polymerizable group contained in the polymerizable liquid crystal compound. Therefore, as the polymerizable group of the chiral agent, an unsaturated polymerizable group, an epoxy group, or an aziridinyl group is preferable, an unsaturated polymerizable group is more preferable, and an ethylenically unsaturated polymerizable group is still more preferable.

Further, the chiral agent may be a liquid crystal compound.

It is preferable that the chiral agent contains a photoisomerizable group because a pattern of a desired reflection wavelength corresponding to an emission wavelength can be formed by photomask irradiation using actinic rays or the like after application and alignment. As the photoisomerizable group, an isomerizable site of a compound exhibiting photochromic properties, an azo group, an azoxy group, or a cinnamoyl group is preferable. As specific compounds, compounds described in JP2002-080478A, JP2002-080851A, JP2002-179668A, JP2002-179669A, JP2002-179670A, JP2002-179681A, JP2002-179682A, JP2002-338575A, JP2002-338668A, JP2003-313189A, and JP2003-313292A can be used.

<Light Irradiation Device According to Second Embodiment>

As described above, the light irradiation device 150 according to the second embodiment of the present invention illustrated in FIG. 26 includes the light emitting element 110, the reflective element 170, the liquid crystal optical element 50, and the lens element 160.

The light emitting element 110 is the same as the above-described light emitting element 110 including a plurality of light emitting units arranged in the surface direction.

The reflective element 170 is not limited, and a known light reflection member that specularly reflects (regularly reflects) light can be used. Examples of the reflective element include a reflective element forming a metal film such as aluminum or silver and a reflective element forming a dielectric multilayer film.

A plurality of light beams emitted from the light emitting element 110 are reflected by the reflective element 170 and then incident on the liquid crystal optical element 50.

As described above, the cholesteric liquid crystal layer 52 of the liquid crystal optical element 50 has the liquid crystal alignment pattern in which the optical axis derived from the liquid crystal compound rotates in the X direction. Therefore, the liquid crystal optical element 50 reflects the light which has been incident by inclining the light in the arrow X direction with respect to the specular reflection. In this manner, the light reflected by the liquid crystal optical element 50 can be properly incident on the lens element 160 disposed in a direction different from the specular reflection. That is, the liquid crystal optical element 50 and the reflective element 170 have a function of guiding the light emitted from the light emitting element 110 to the lens element 160. As illustrated in FIG. 26, the respective elements may be arranged at intervals.

Here, the incidence angle of light from the reflective element 170 to the liquid crystal optical element 50 varies depending on the position of the liquid crystal optical element 50. Therefore, in order to properly reflect the light toward the lens element 160 according to the incidence angle of the light on the liquid crystal optical element 50, regions with different lengths of the single period Λ are formed in the plane of the cholesteric liquid crystal layer 52. For example, in the cholesteric liquid crystal layer 52, the single period Λ is gradually increased in the arrow X direction.

The lens element 160 diverges or focuses a plurality of light (light beams) which has been incident from the center of the surface direction toward the outward direction. That is, the lens element 160 optically exhibits the same operation as that of the liquid crystal optical element 10 of the light irradiation device 100 described above.

The light irradiation device 150 includes the lens element 160, and thus a desired optical pattern can be projected on an object by distributing the plurality of light beams (optical paths of the plurality of light beams) emitted from different positions in the plane of the light emitting element 110 into light beams traveling in different directions and diverging or focusing the light beams.

Therefore, as the lens element 160, the liquid crystal optical element including the optically anisotropic layer having the liquid crystal alignment pattern described above may be used. As an example, as illustrated in FIG. 8, a liquid crystal optical element that includes the optically anisotropic layer 34 with a concentric liquid crystal alignment pattern in which the one directions in which the orientation of the optical axis of the liquid crystal compound 30 continuously changes rotationally are concentric from the inside toward the outside may be used as the lens element 160. It is preferable that the liquid crystal optical element is used as the lens element 160 from the viewpoint of reducing the thickness of the light irradiation device.

The lens element 160 is not limited to the liquid crystal optical element, and various optical elements can be used as long as these optical elements exhibit similar optical effects. Examples of the lens element 160 include a convex lens and a concave lens.

Figure 27:
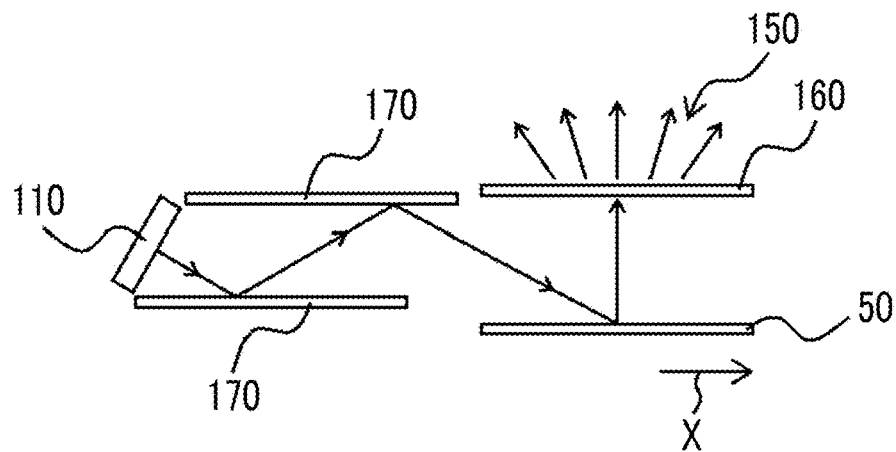
FIG. 27 is a view illustrating another example of the light irradiation device of the present invention.

FIG. 27 conceptually illustrates another example of the light irradiation device 150 according to the embodiment of the present invention.

As an example, the light irradiation device 150 that uses the liquid crystal optical element 50 including a cholesteric liquid crystal layer may include the liquid crystal optical element 50, the light emitting element 110, the lens element 160, and a plurality of the reflective elements 170, as illustrated in FIG. 27.

In the present example, the light emitted from the light emitting element 110 is reflected by the reflective elements 170 on the lower side in the figure and reflected by the reflective element 170 on the upper side in the figure. Thereafter, similarly, the light is incident on the liquid crystal optical element 50, reflected by the liquid crystal optical element 50, then incident on the lens element 160 so that a desired optical pattern can be projected.

The liquid crystal optical element 10 and the reflective element 170 have a function of guiding the light emitted from the light emitting element 110 to the lens element 160. As illustrated in FIG. 27, the respective elements may be arranged at intervals.

Figure 28:
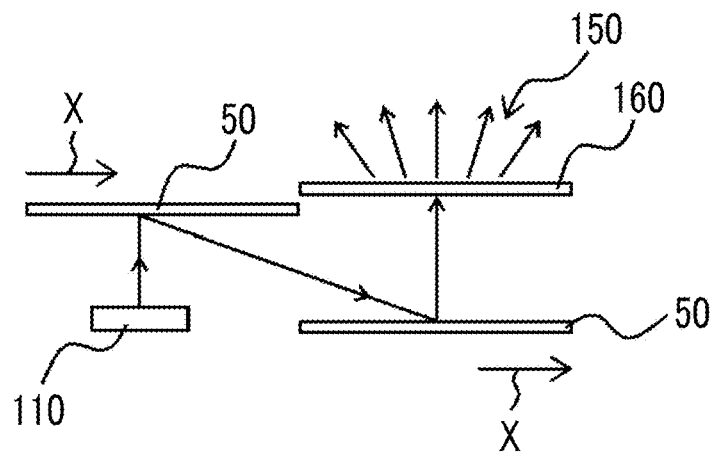
FIG. 28 is a view illustrating another example of the light irradiation device of the present invention.

FIG. 28 conceptually illustrates another example of the light irradiation device 150 according to the embodiment of the present invention.

As an example, the light irradiation device 150 that uses the liquid crystal optical element 50 including a cholesteric liquid crystal layer may have a configuration provided with a plurality of the liquid crystal optical elements 50, the light emitting element 110, and the lens element 160 as illustrated in FIG. 28. Each liquid crystal optical element 50 has a liquid crystal alignment pattern in which the optical axis derived from the liquid crystal compound continuously rotates in the arrow X direction.

The light emitted from the light emitting element 110 is incident on the liquid crystal optical element 50 on the upper side in the figure. As described above, the liquid crystal optical element 50 has the liquid crystal alignment pattern in which the optical axis derived from the liquid crystal compound continuously rotates in the arrow X direction. Therefore, the light reflected by the liquid crystal optical element 50 is reflected by being inclined in the arrow X direction and is incident on the liquid crystal optical element 50 on the lower side in the figure. Thereafter, similarly, the light is reflected by the liquid crystal optical element 50 on the lower side in the figure and is incident on the lens element 160 so that a desired optical pattern can be projected.

The liquid crystal optical element 10 has a function of guiding the light emitted from the light emitting element 110 to the lens element 160. As illustrated in FIG. 28, the respective elements may be arranged at intervals.

The light irradiation device 150 according to the embodiment of the present invention illustrated in FIGS. 26 to 28 uses the liquid crystal optical element 50 including a cholesteric liquid crystal layer. The light irradiation device 150 is capable of distributing light having high directivity in different directions and projecting a desired optical pattern on an object even in a case where the beam divergence angle of the light emitted from the light emitting element 110 is relatively large.

In the case where the beam divergence angle of the light is relatively large, it is preferable that the light emitting element 110 is disposed at the focal point of the lens element 160 in order to convert the light emitted from the light emitting element 110 into light having high directivity.

Further, in order to enhance the directivity of the light emitted from the lens element 160, it is preferable to use a lens having a large F number(=focal length of lens/effective aperture), that is, a large focal length in a case of the same effective aperture. Therefore, in order to convert the light emitted from the light emitting element 110 into light having high directivity, it is necessary to provide a certain optical path length between the light emitting element 110 and the lens element 160. According to the light irradiation device 150 according to the embodiment of the present invention that uses the liquid crystal optical element 50 reflecting light, a sufficient optical path length can be ensured between the light emitting element 110 and the lens element 160 by reflecting the light so as to turn the light back.

Here, in the optical light guide element described in JP2018-500589A, reduction in thickness is attempted by reflecting light on the second reflection surface disposed in parallel with the first reflection surface and converting the direction of the light to be incident on the optical light guide element into a direction orthogonal to the direction. However, there is a limit to the reduction in thickness because the reflection surface is disposed at an angle of approximately 45° with respect to the incident direction of light.

Meanwhile, in the light irradiation device 150 according to the embodiment of the present invention, the liquid crystal optical element 50 including the cholesteric liquid crystal layer with the liquid crystal alignment pattern in which the optical axis rotates in one direction is used. In such light irradiation device 150 according to the embodiment of the present invention as described above, the liquid crystal optical element 50 (cholesteric liquid crystal layer) can reflect light in a direction different from the regular reflection direction. Therefore, according to the light irradiation device 150 according to the embodiment of the present invention, further reduction in thickness can be realized.

Even in the light irradiation device 150 that uses the liquid crystal optical element 50 including the cholesteric liquid crystal layer, the diffractive optical element 146 may be used similarly to the case of the light irradiation device 100 according to the first embodiment.

Figure 29:
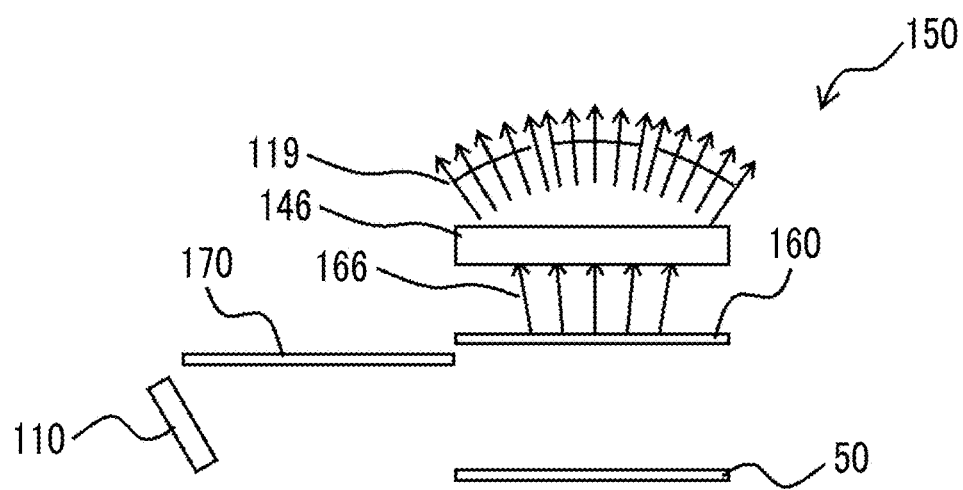
FIG. 29 is a view illustrating another example of the light irradiation device of the present invention.

For example, as illustrated in FIG. 29, a configuration in which the diffractive optical element 146 is disposed downstream of the lens element 160 can also be preferably used in the light irradiation device 150 illustrated in FIG. 26.

Since the light irradiation device 150 includes the diffractive optical element 146, the light 166 (optical pattern) transmitted through the lens element 160 can be projected as the light 119 duplicated in a wider angle region.

Further, even in the light irradiation device 150 that uses the liquid crystal optical element 50 including the cholesteric liquid crystal layer, the lens array 140 may be used in combination as necessary similarly to the case of the light irradiation device 100 described above.

Further, even in the light irradiation device 150 that uses the liquid crystal optical element 50 including the cholesteric liquid crystal layer, the phase difference plate 120 may be used in combination as illustrated in FIG. 13 and the polarizer 130 and the phase difference plate 120 may be used in combination as illustrated in FIG. 14, as necessary.

Figure 24:
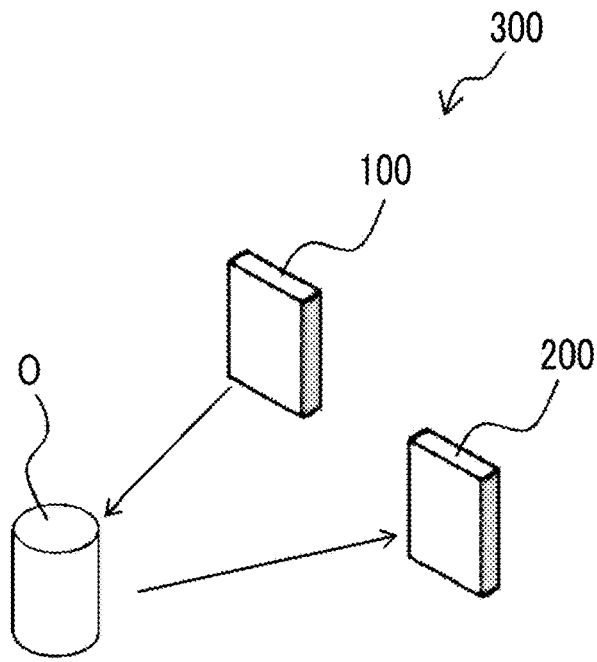
FIG. 24 is a view illustrating an example of a sensor of the present invention.

FIG. 24 conceptually illustrates an example of a sensor according to the embodiment of the present invention that uses the light irradiation device according to the embodiment of the present invention.

A sensor 300 illustrated in FIG. 24 is configured to include the light irradiation device 100 according to the embodiment of the present invention that applies an optical pattern and a light receiving element 200 (optical camera) that performs photometry on the optical pattern.

The sensor 300 illustrated in FIG. 24 is a sensor that allows the optical pattern applied from the light irradiation device 100 to be incident on the object O (measurement target) and allows the light reflected by the object O to be incident on the light receiving element 200.

In the sensor 300, for example, authentication of the object O is performed based on the difference between the optical pattern applied by the light irradiation device 100 and the optical pattern received by the light receiving element 200.

Hereinbefore, the light irradiation device and the sensor according to the embodiment of the present invention have been described in detail, but the present invention is not limited to the above-described examples, and various improvements and modifications may be made without departing from the scope of the present invention.

EXAMPLES

The features of the present invention will be described in more detail with reference to the following examples. The materials, reagents, used amounts, substance amounts, ratios, treatment contents, treatment procedures, and the like described in the following examples can be appropriately changed without departing from the spirit of the present invention. Therefore, the scope of the present invention should not be limitatively interpreted by the following specific examples.

Example 1

<Preparation of Liquid Crystal Optical Element>
(Support and Saponification Treatment on Support)

A commercially available triacetyl cellulose film (Z-TAC, manufactured by FUJIFILM Corporation) was prepared as a support.

The support was allowed to pass through a dielectric heating roll at a temperature of 60° C. to raise the surface temperature of the support to 40° C. Thereafter, one surface of the support was coated with an alkaline solution described below such that the coating amount thereof was set to 14 mL (liter)/m² using a bar coater, and the support was heated to 110° C. and transported under a steam type far infrared heater (manufactured by Noritake Co., Ltd.) for 10 seconds.

Next, the surface of the support which had been coated with the alkaline solution was coated with 3 mL/m² of pure water using a bar coater in the same manner as described above. Next, after the surface was washed with water using a fountain coater and drained using an air knife 3 times repeatedly, and the surface of the support was subjected to an alkali saponification treatment by transporting a drying zone at 70° C. for 10 seconds to be dried.

Alkaline Solution
  Potassium hydroxide: 4.70 parts by mass
  Water: 15.80 parts by mass
  Isopropanol: 63.70 parts by mass
Surfactant
  SF-1: $C_{14}H_{29}O(CH_2CH_2O)_2OH$: 1.0 parts by mass
  Propylene glycol: 14.8 parts by mass (Formation of Undercoat Layer)

The alkali-saponified surface of the support was continuously coated with a coating solution for forming an undercoat layer described below using a #8 wire bar. The support on which the coated film was formed was dried with hot air at 60° C. for 60 seconds and further dried with hot air at 100° C. for 120 seconds to form an undercoat layer.

Coating Solution for Forming Undercoat Layer
  Modified polyvinyl alcohol shown below: 2.40 parts by mass
  Isopropyl alcohol: 1.60 parts by mass
  Methanol: 36.00 parts by mass
  Water: 60.00 parts by mass

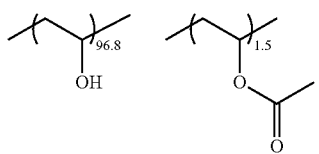
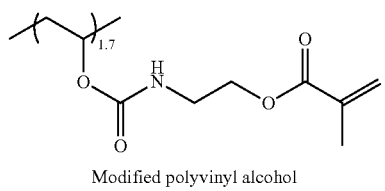

Modified polyvinyl alcohol (Formation of Alignment Film)

The support on which the undercoat layer had been formed was continuously coated with a coating solution for forming an alignment film described below using a #2 wire bar. The support on which the coated film of the coating solution for forming an alignment film had been formed was dried on a hot plate at 60° C. for 60 seconds, thereby forming an alignment film.

Coating Solution for Forming Alignment Film
  Photo-alignment material A: 1.00 part by mass
  Water: 16.00 parts by mass
  Butoxyethanol: 42.00 parts by mass
  Propylene glycol monomethyl ether: 42.00 parts by mass —Photo-Alignment Material A—

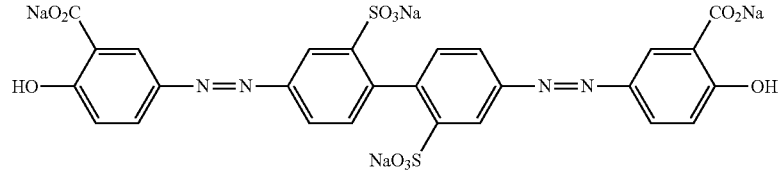

(Exposure of Alignment Film)

The alignment film was exposed using the exposure device illustrated in FIG. 9, thereby forming an alignment film P-1 having an alignment pattern.

In the exposure device, a laser emitting laser light having a wavelength (325 nm) was used as a laser. The exposure amount by interference light was set to 100 mJ/cm².

(Formation of Optically Anisotropic Layer)

The following composition A-1 was prepared as a liquid crystal composition forming an optically anisotropic layer.

Composition A-1
  Liquid crystal compound L-1: 100.00 parts by mass
  Polymerization initiator (Irgacure (registered trademark) 907, manufactured by BASF SE): 3.00 parts by mass
  Photosensitizer (KAYACURE DETX-S, manufactured by Nippon Kayaku Co., Ltd.): 1.00 part by mass
  Leveling agent T-1: 0.08 parts by mass
  Methyl ethyl ketone: 313.00 parts by mass
  Liquid Crystal Compound L-1

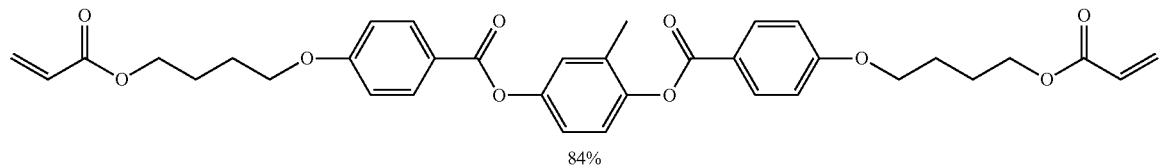

84%

-continued

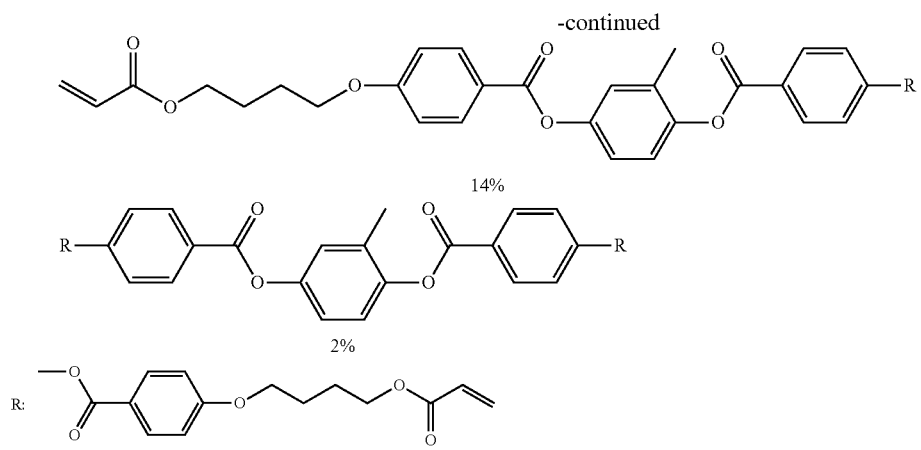

Leveling Agent T-1

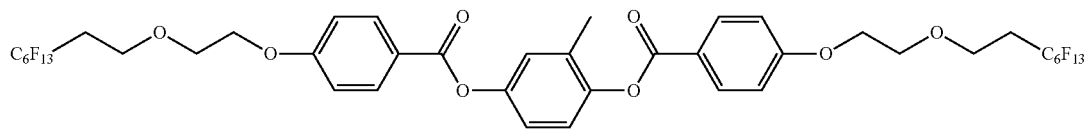

The optically anisotropic layer was formed by coating the alignment film P-1 with multiple layers of the composition A-1. The multilayer coating indicates that the alignment film was first coated with the composition A-1 for the first layer, heated, cooled, and UV-cured to prepare a liquid crystal fixing layer, and the liquid crystal fixing layer was overcoated with the composition A-1 for the second and subsequent layers to perform coating, heated, cooled, and UV-cured in the same manner as described above and this process was repeatedly performed. By forming the optically anisotropic layer through multilayer coating, the alignment direction of the alignment film was reflected from the lower surface to the upper surface of the liquid crystal layer even in a case where the total thickness of the liquid crystal layer was increased.

The alignment of the liquid crystal compound was fixed by first coating the alignment film P-1 with the following composition A-1 for the first layer, and the coated film was heated on a hot plate at 70° C., cooled to 25° C., and irradiated with ultraviolet rays having a wavelength of 365 nm at an irradiation dose of 100 mJ/cm$^2$ in a nitrogen atmosphere using a high-pressure mercury lamp. At this time, the film thickness of the first liquid crystal layer was 0.2 μm.

The liquid crystal fixing layer was prepared by overcoating the liquid crystal layer with the composition for the second and subsequent layers, heating the layers under the same conditions described above, cooling the layers, and UV-curing the layers. In this manner, the overcoating was repeated performed until the total thickness reached a desired film thickness so that an optically anisotropic layer was formed and a liquid crystal optical element was prepared.

Further, the retardation value "$\Delta n_\lambda \times d$" of the optically anisotropic layer was measured at a target wavelength using AxoScan (manufactured by Axometrics, Inc.), and the film thickness was measured using a scanning electron microscope (SEM).

It was confirmed that $\Delta n_{940} \times$thickness (Re(940)) of the liquid crystal finally reached 470 nm and the optically anisotropic layer had a concentric (radial) periodic alignment surface as illustrated in FIG. 8 using a polarizing microscope. Further, the liquid crystal alignment pattern of this optically anisotropic layer was a liquid crystal alignment pattern formed such that the single period of the central portion was 328 μm, the single period from the center to a distance of 1.0 mm was 27 μm, the single period from the center to a distance of 2.0 mm was 13.5 μm, and the period was shortened toward the outward direction, in the single period in which the optical axis of the liquid crystal compound rotates by 180°. Hereinafter, the measurement of "$\Delta n_{940} \times d$" and the like was performed in the same manner as described above unless otherwise specified.

<Preparation of Light Emitting Element>

A surface light source having high directivity was prepared with reference to US2010/0118123A. A laser diode having a wavelength of 940 nm was used as a light source.

Further, aluminum was vapor-deposited on a black polyethylene terephthalate (PET) film, and the film was punched to form a plurality of circular holes each having a diameter of 30 μm, thereby preparing a mask for a light emitting element.

<<Preparation of λ/4 Plate>>

(Formation of Alignment Film P-10)

The support on which the undercoat layer had been formed was continuously coated with a coating solution for forming an alignment film P-10 described below using a #2.4 wire bar. The support on which the coated film of the coating solution for forming an alignment film P-10 had been formed was dried on a hot plate at 80° C. for 5 minutes to form an alignment film P-10.

Coating Solution for Forming Alignment Film P-10

Photo-alignment material, polymer A2: 4.35 parts by mass

Low-molecular-weight compound B2: 0.80 parts by mass

Crosslinking agent C1: 2.20 parts by mass

Compound D1: 0.48 parts by mass

Compound D2: 1.15 parts by mass

Butyl acetate: 100.00 parts by mass ((Synthesis of Polymer A2))

A reaction container provided with a stirrer, a thermometer, a dropping funnel, and a reflux cooling tube was charged with 100 parts by mass of 2-(3,4-epoxycyclohexyl)ethyltrimethoxysilane, 500 parts by mass of methyl isobutyl ketone, and 10 parts by mass of triethylamine, and the mixture was mixed at room temperature. Next, 100 parts by mass of deionized water was added dropwise to the solution in the reaction container for 30 minutes using the dropping funnel, and the obtained solution was allowed to react at 80° C. for 6 hours while being mixed under reflux. After completion of the reaction, an organic phase was taken out from the solution, and the organic phase was washed until water after the organic phase was washed with a 0.2 mass % ammonium nitrate aqueous solution became neutral. Thereafter, the solvent and water were distilled off under reduced pressure, thereby obtaining epoxy-containing polyorganosiloxane in the form of a viscous and transparent liquid.

The nuclear magnetic resonance ($^1$H-NMR) evaluation was performed on the epoxy-containing polyorganosiloxane. As the result, it was confirmed that a peak based on an oxiranyl group was obtained around a chemical shift (δ) of 3.2 ppm according to the theoretical strength, and side reactions of the epoxy group did not occur during the reaction. The weight-average molecular weight Mw of the epoxy-containing polyorganosiloxane was 2,200 and the epoxy equivalent thereof was 186 g/mol.

Next, a 100 mL three-neck flask was charged with 10.1 parts by mass of the epoxy-containing polyorganosiloxane obtained in the above-described manner, 0.5 parts by mass of acrylic group-containing carboxylic acid ("ARONIX M-5300", manufactured by Toagosei Co., Ltd., acrylic acid w-carboxypolycaprolactone (polymerization degree n of approximately 2)), 20 parts by mass of butyl acetate, 1.5 parts by mass of a cinnamic acid derivative obtained by the method of Synthesis Example 1 of JP2015-026050A, and 0.3 parts by mass of tetrabutylammonium bromide, and the obtained reaction solution was stirred at 90° C. for 12 hours. After completion of the reaction, the reaction solution was diluted with butyl acetate whose amount (mass) was set to be the same as the amount of the reaction solution, and the resulting solution was washed with water three times.

An operation of concentrating the obtained solution and diluting the solution with butyl acetate was repeated twice to finally obtain a solution containing polyorganosiloxane (polymer A2 shown below) having a photoalignment group. The weight-average molecular weight Mw of the polymer A2 was 9,000. Further, as the result of $^1$H-NMR, the content of the component containing a cinnamate group in the polymer A2 was 23.7% by mass.

—Polymer A2—

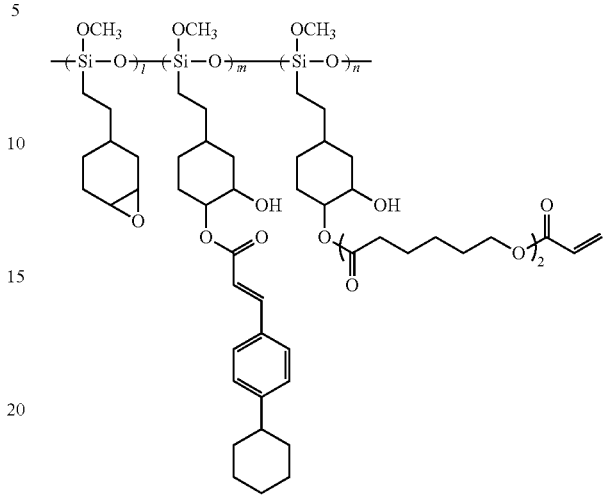

—Low-Molecular-Weight Compound B2—

A low-molecular-weight compound B2 represented by the following formula (NOMSCORT TAB, manufactured by Nisshin OilliO Group, Ltd.) was used.

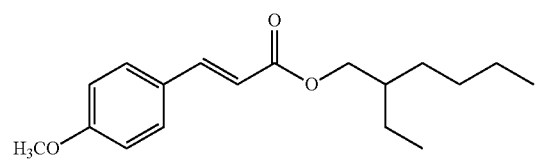

—Crosslinking Agent C1—

A crosslinking agent C1 represented by the following formula (DENACOL EX411, manufactured by Nagase ChemteX Corporation) was used.

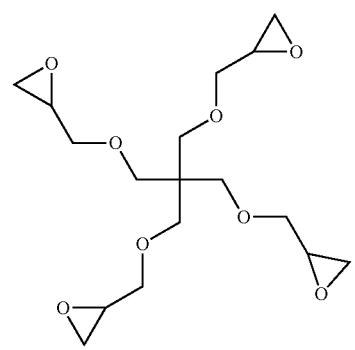

—Compound D1—

A compound D1 represented by the following formula (aluminum chelate A(W), manufactured by Kawaken Fine Chemicals Co., Ltd.) was used.

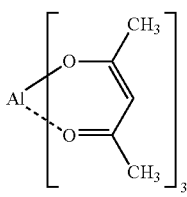

D1

—Compound D2—

A compound D2 represented by the following formula (triphenylsilanol, manufactured by Toyo Science Corp.) was used.

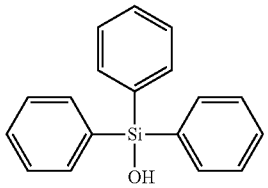

D2

(Exposure of Alignment Film P-10)

The obtained alignment film P-10 was irradiated with polarized ultraviolet rays (20 mJ/cm$^2$, using an ultrahigh-pressure mercury lamp) to expose the alignment film P-10.

<<Preparation of Optically Anisotropic Layer (λ/4 Plate)>>

The optically anisotropic layer was formed by coating the alignment film P-10 with the composition A-1. The coated film which had been coated with the composition was heated on a hot plate at 70° C., cooled to 25° C., and irradiated with ultraviolet rays having a wavelength of 365 nm at an irradiation dose of 500 mJ/cm$^2$ in a nitrogen atmosphere using a high-pressure mercury lamp so that the alignment of the liquid crystal compound was fixed, thereby preparing an optically anisotropic layer.

The $\Delta n_{940} \times d$ (Re(940)) of the obtained optically anisotropic layer was 235 nm.

The surface light source, the polarizing plate, the λ/4 plate, and the mask for a light emitting element mask were disposed in this order to prepare a light emitting element.

The beam divergence angle of the light emitted from the light emitting element was 1°. Further, the light emitted from the light emitting element was circularly polarized light.

The light emitting element and the liquid crystal optical element were laminated on each other, thereby preparing a light irradiation device.

Example 2

A light irradiation device was prepared in the same manner as in Example 1 except that a diffusion plate was disposed between the surface light source and the polarizing plate and the beam divergence angle of the light emitted from the light emitting element was set to 4°.

Example 3

A liquid crystal optical element was prepared in the same manner as in Example 1. A light emitting element was prepared in the same manner as in Example 2.

<Preparation of Lens Array>

The alignment film was exposed using the exposure device illustrated in FIG. 9 to form an alignment film P-3 having an alignment pattern.

In the exposure device, a laser emitting laser light having a wavelength (325 nm) was used as a laser. The exposure amount by interference light was set to 100 mJ/cm$^2$.

Further, the exposure was performed using a mask in which an opening having a square shape was formed such that sites other than the opening were not exposed. The alignment film P-3 was exposed by repeating the step of shifting the mask and exposing adjacent sites. The rotation pitch of the pattern formed by the interference of two laser light beams was controlled by changing the f number of the lens, the lens effective aperture, the focal length, and the distance between the lens and the plane of the alignment film P-3.

An optically anisotropic layer was prepared in the same manner as that for the liquid crystal optical element of Example 1 except that the alignment film P-3 was used.

It was confirmed that $\Delta n_{940} \times$ thickness (Re(940)) of the liquid crystal finally reached 470 nm and the prepared optically anisotropic layer had a liquid crystal lens array in which a plurality of concentric (radial) periodic alignments as illustrated in FIG. 19 were arranged in the plane using a polarizing microscope.

The light emitting element, the lens array, and the liquid crystal optical element were arranged in this order, thereby preparing a light irradiation device. Further, the light emitting units of the light emitting element were arranged at the focal position of the lens array.

Example 4

A liquid crystal optical element was prepared in the same manner as in Example 1.

A surface light source and a mask for a light emitting element were produced in the same manner as in the preparation of the light emitting element of Example 1.

The surface light source, the polarizing plate, and the mask for a light emitting element were arranged in this order, thereby preparing a light emitting element.

The beam divergence angle of the light emitted from the light emitting element was 1°. Further, the light emitted from the light emitting element was linearly polarized light.

A λ/4 plate was prepared in the same manner as in Example 1.

The light emitting element, the λ/4 plate, and the liquid crystal optical element were laminated in this order, thereby preparing a light irradiation device.

Example 5

A liquid crystal optical element was prepared in the same manner as in Example 1.

A surface light source and a mask for a light emitting element were produced in the same manner as in the preparation of the light emitting element of Example 1.

The surface light source and the mask for a light emitting element were arranged in this order, thereby preparing a light emitting element.

The beam divergence angle of the light emitted from the light emitting element was 1°. Further, the light emitted from the light emitting element was non-polarized light.

A λ/4 plate was prepared in the same manner as in Example 1.

The light emitting element, the polarizing plate, the λ/4 plate, and the liquid crystal optical element were laminated in this order, thereby preparing a light irradiation device.

Example 6

A liquid crystal optical element and a light emitting element were prepared in the same manner as in Example 1.
<Production of Optical Diffraction Element>
An alignment film P-7 was formed in the same manner as that for the alignment film P-1 except that the exposure device illustrated in FIG. 7 was used as the exposure device for exposing the alignment film. Further, the single period of the alignment pattern formed by interference of two laser beams (the length at which the optical axis derived from the liquid crystal compound rotated by 180°) was controlled by changing the crossing angle (crossing angle α) of the two light beams.

A liquid crystal diffraction element was prepared by forming an optically anisotropic layer in the same manner as that for the liquid crystal optical element of Example 1 except that the alignment film P-7 was coated with multiple layers of the composition A-1 to obtain a desired film thickness.

It was confirmed that $\Delta n_{940} \times$ thickness (Re(940)) of the liquid crystal finally reached 287 nm and the optically anisotropic layer had a periodic alignment surface as illustrated in FIG. 4 using a polarizing microscope. Further, in the liquid crystal alignment pattern of the optically anisotropic layer, the single period in which the optical axis derived from the liquid crystal compound rotated 180° was 6.5 μm.

Example 7

<Preparation of Liquid Crystal Optical Element>
(Exposure of Alignment Film)
An alignment film was formed in the same manner as that for the alignment film P-1 of Example 1, and the alignment film was exposed using an exposure device capable of scanning, exposing, and patterning a photo-alignment film while optionally changing the polarization direction of focused laser light, thereby forming an alignment film P-2 having an alignment pattern. In the exposure device, a laser emitting laser light having a wavelength (325 nm) was used as a laser.
(Formation of Optically Anisotropic Layer)
The following composition C-1 was prepared as the liquid crystal composition forming the cholesteric liquid crystal layer. The composition C-1 is a liquid crystal composition which has a selective reflection center wavelength of 940 nm and forms a cholesteric liquid crystal layer (cholesteric liquid crystal phase) that reflects right circularly polarized light.
Composition C-1
   Rod-like liquid crystal compound L-1: 100.00 parts by mass
   Polymerization initiator (Irgacure (registered trademark) 907, manufactured by BASF SE): 3.00 parts by mass
   Photosensitizer (KAYACURE DETX-S, manufactured by Nippon Kayaku Co., Ltd.): 1.00 part by mass
   Chiral agent Ch-1: 3.11 parts by mass
   Leveling agent T-1: 0.08 parts by mass
   Methyl ethyl ketone: 977.00 parts by mass
Chiral Agent Ch-1

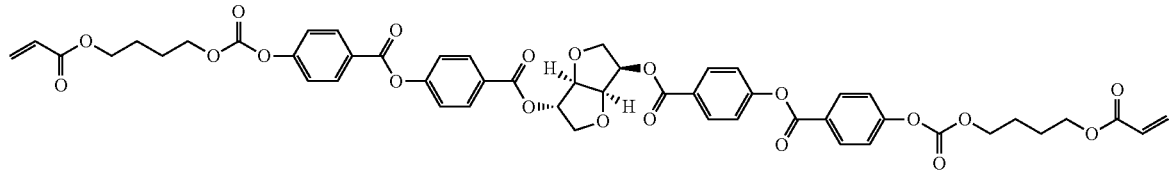 [SMILES: C=CC(=O)OCCCCOC(=O)Oc1ccc(C(=O)Oc2ccc(C(=O)O[C@H]3CO[C@H]4[C@@H]3OC[C@H]4OC(=O)c3ccc(OC(=O)c4ccc(OC(=O)OCCCCOC(=O)C=C)cc4)cc3)cc2)cc1]

Further, a first liquid crystal diffraction element and a second liquid crystal diffraction element were prepared as the liquid crystal diffraction element.

A first λ/4 plate and a second λ/4 plate were prepared in the same manner as in Example 1.

The prepared liquid crystal diffraction element and the λ/4 plate were laminated in order of the first λ/4 plate, the first liquid crystal diffraction element, the second λ/4 plate, and the second liquid crystal diffraction element, thereby preparing an optical diffraction element including the liquid crystal diffraction element and the λ/4 plate. Further, the first liquid crystal diffraction element and the second liquid crystal diffraction element were laminated such that each one direction (arrow X direction) in which the optical axis rotated in the optically anisotropic layer was orthogonal to each other.

The light emitting element, the liquid crystal optical element, and the prepared optical diffraction element were laminated, thereby preparing a light irradiation device. Further, the optical diffraction element was laminated such that the side of the first λ/4 plate was on the side of the liquid crystal optical element.

The cholesteric liquid crystal layer was formed by coating the alignment film P-2 with multiple layers of the composition C-1.

The alignment of the liquid crystal compound was fixed by first coating the alignment film P-2 with the composition C-1 for the first layer, and the coated film was heated on a hot plate at 95° C., cooled to 25° C., and irradiated with ultraviolet rays having a wavelength of 365 nm at an irradiation dose of 100 mJ/cm² in a nitrogen atmosphere using a high-pressure mercury lamp. At this time, the film thickness of the first liquid crystal layer was 0.2 μm.

The liquid crystal fixing layer was prepared by overcoating the liquid crystal layer with the composition for the second and subsequent layers, heating the layers under the same conditions described above, cooling the layers, and UV-curing the layers. In this manner, the overcoating was repeated performed until the total thickness reached a desired film thickness so that a reflective cholesteric liquid crystal layer was formed.

The cross section of the reflective layer was confirmed using a SEM. As the result, the cholesteric liquid crystal phase of the reflective cholesteric liquid crystal layer was 8 pitches.

It was confirmed that the cholesteric liquid crystal layer had periodic alignment in which the single period of the liquid crystal alignment pattern was gradually increased in one direction using a polarizing microscope. Further, the liquid crystal alignment pattern of the cholesteric liquid crystal layer was a liquid crystal alignment pattern formed such that the single period in which the optical axis of the liquid crystal compound rotated 180° was in a range of 1.0 to 1.2 µm and the period was increased in one direction.

<Preparation of Light Emitting Element>

A light emitting element was prepared in the same manner as in Example 1 except that a diffusion plate was disposed between the surface light source and the polarizing plate and the beam divergence angle of the light emitted from the light emitting element was set to 10°.

<Preparation of Lens Element>

A liquid crystal optical element was prepared in the same manner as that for the liquid crystal optical element of Example 1 and used as a lens element.

A light irradiation device illustrated in FIG. 27 was prepared using a mirror coated with silver as a reflective element and using the liquid crystal optical element, the light emitting element, and the lens element which had been prepared in the above-described manner.

Example 8

An optical diffraction element including a liquid crystal diffraction element and a λ/4 plate was prepared in the same manner as in Example 6.

A light irradiation device was prepared in the same manner as in Example 7, and an optical diffraction element was disposed downstream of the lens element, thereby preparing a light irradiation device of the present example. Further, the liquid crystal diffraction element was disposed such that the side of the first λ/4 plate was on the side of the lens element.

Comparative Example 1

A light irradiation device was prepared in the same manner as that for the light irradiation device of Example 1 except that the liquid crystal optical element was not provided.

[Evaluation of Optical Pattern]

The optical pattern projected from the prepared light irradiation device was evaluated.

The optical pattern was projected by the light irradiation device on a screen disposed at a distance of 30 cm in the normal direction of the light irradiation device, and an image imaged by an infrared camera was evaluated.

In the light irradiation device of Comparative Example 1, the individual light beams emitted from the light emitting element were not distributed at different angles, and the projection range was not expanded in the projection image projected on the screen. Therefore, an optical pattern formed of a plurality of enlarged projected light dots was not able to be observed.

Meanwhile, in the light irradiation device of Example 1, it was observed that the individual light beams emitted from the light emitting element were distributed at different angles and an optical pattern formed of a plurality of light dots was projected on the screen.

In the light irradiation device of Example 2, the size of dots of the projected optical pattern was increased and the resolution was slightly degraded as compared with the light irradiation device of Example 1.

In the light irradiation device of Example 3, the size of dots of the projected optical pattern was decreased and the resolution was improved as compared with the light irradiation device of Example 2.

In the light irradiation devices of Examples 4 and 5, the same optical pattern as that of the light irradiation device of Example 1 was observed.

In the light irradiation device of Example 6, it was observed that the optical pattern in the light irradiation device of Example 1 was duplicated and projected in the horizontal direction and the vertical direction (9 regions) of the screen.

In the light irradiation device of Example 7, it was observed that the light from the light emitting element was distributed at different angles and the optical pattern was projected on the screen.

In the light irradiation device of Example 8, it was observed that the optical pattern in the light irradiation device of Example 7 was duplicated and projected in the horizontal direction and the vertical direction (9 regions) of the screen.

The thickness of the light irradiation device from the surface of the light emitting element in Examples 1 to 5 was approximately 1.5 mm. In Example 7, the thickness (the direction orthogonal to the arrow X) of the thickest portion of the configuration consisting of the liquid crystal optical element 50, the lens element 160, and the reflective element 170 illustrated in FIG. 27 was approximately 1.5 mm. In these examples, the thickness of the light irradiation device (excluding the optical diffraction element) projecting an optical pattern mounted on a smartphone or the like was thinner than approximately 3 mm.

The thickness of the light irradiation device from the surface of the light emitting element of Example 6 was approximately 2 mm. Further, in Example 8, the thickness of the thickest portion (in the direction orthogonal to the arrow X) of the configuration obtained by adding the optical diffraction element to the configuration consisting of the liquid crystal optical element 50, the lens element 160, and the reflective element 170 illustrated in FIG. 27 was approximately 2 mm. In these examples, the thickness of the light irradiation device (including the optical diffraction element) projecting an optical pattern mounted on a smartphone or the like was thinner than approximately 4 mm.

As described above, the light irradiation device according to the embodiment of the present invention, including the light emitting element which includes a plurality of light emitting units in the plane, and the liquid crystal optical element, in which the liquid crystal optical element has the optically anisotropic layer formed using a liquid crystal composition containing a liquid crystal compound, the optically anisotropic layer has a liquid crystal alignment pattern in which the orientation of the optical axis derived from the liquid crystal compound continuously changes rotationally along at least one in-plane direction and has regions with different lengths of periods in the liquid crystal alignment pattern in a case where the length over which the orientation of the optical axis derived from the liquid crystal compound rotates by 180° in the plane is defined by a single period, is thin and capable of suitably projecting an optical pattern.

Based on the above-described results, the effects of the present invention are apparent.

The light irradiation device can be suitably used for various applications for projecting optical patterns such as a sensor.

EXPLANATION OF REFERENCES

10, 50: liquid crystal optical element
20: support

24: alignment film
26, 34: optically anisotropic layer
30: liquid crystal compound
30A: optical axis
52: cholesteric liquid crystal layer
60, 80: exposure device
62, 82: laser
64, 84: light source
68: beam splitter
70A, 70B, 90A, 90B: mirror
72A, 72B, 96: λ/4 plate
86.94: polarized light beam splitter
92: lens
100, 150: light irradiation device
110: light emitting element
112: light emitting unit
116, 117, 118, 119, 166: light
120: phase difference plate
130: polarizer
140: lens array
142: small region
146: diffractive optical element
160: lens element
170: reflective element
200: light receiving element
M: laser light
MA, MB: light beam
MP: P-polarized light
MS: S-polarized light
$P_O$: linearly polarized light
$P_R$: right circularly polarized light
$P_L$: left circularly polarized light
Q, Q1, Q2: absolute phase
E, E1, E2: equiphase surface
O: object

What is claimed is:

1. A light irradiation device that projects an optical pattern formed of a plurality of dots, the light irradiation device comprising:
   a light emitting element which includes a plurality of light emitting units arranged two-dimensionally in a plane;
   a liquid crystal optical element; and
   a phase difference plate between the light emitting element and the liquid crystal optical element,
   wherein the light emitting units of the light emitting element emit light beams,
   the liquid crystal optical element has an optically anisotropic layer formed using a liquid crystal composition containing a liquid crystal compound,
   the optically anisotropic layer has a liquid crystal alignment pattern in which orientation of an optical axis derived from the liquid crystal compound continuously changes rotationally along at least one in-plane direction and has regions with different lengths of periods in the liquid crystal alignment pattern in a case where a length over which the orientation of the optical axis derived from the liquid crystal compound rotates by 180° in the plane is denoted by a single period,
   the liquid crystal optical element distributes the light beams emitted from the light emitting units of the light emitting element into light beams traveling in different directions and projects the optical pattern formed of the plurality of dots, and
   the phase difference plate converts the light beams incident on the liquid crystal optical element into circularly polarized light.

2. The light irradiation device according to claim 1, wherein the single period of the liquid crystal alignment pattern is gradually shortened toward the one direction in which the orientation of the optical axis derived from the liquid crystal compound in the liquid crystal alignment pattern continuously changes rotationally.

3. The light irradiation device according to claim 1, wherein the liquid crystal optical element is a transmission type optical element that refracts and transmits incidence ray.

4. The light irradiation device according to claim 3, wherein the liquid crystal alignment pattern of the optically anisotropic layer is a concentric circular pattern in which the one directions in which the orientation of the optical axis derived from the liquid crystal compound continuously changes rotationally are concentric from an inside toward an outside.

5. The light irradiation device according to claim 3, wherein in the liquid crystal alignment pattern of the optically anisotropic layer, each rotation direction of the orientation of the optical axis derived from the liquid crystal compound toward the one direction is identical in all the one directions.

6. The light irradiation device according to claim 1, wherein the optically anisotropic layer is a cholesteric liquid crystal layer formed by fixing a cholesteric liquid crystal phase.

7. The light irradiation device according to claim 6, wherein the direction in which the orientation of the optical axis derived from the liquid crystal compound in the liquid crystal alignment pattern continuously changes rotationally is a single direction.

8. The light irradiation device according to claim 6, further comprising:
   a lens element which causes a plurality of light beams emitted from each of the light emitting units of the light emitting element and reflected on a cholesteric liquid crystal layer of the liquid crystal optical element to be diverged toward an outward direction from a center of the cholesteric liquid crystal layer in a surface direction or to be focused at the center of the cholesteric liquid crystal layer in the surface direction.

9. The light irradiation device according to claim 1, further comprising:
   a lens array in which small regions having a lens function are two-dimensionally arranged between the light emitting element and the liquid crystal optical element.

10. The light irradiation device according to claim 9, wherein one of the small regions in the lens array couples to one of the light emitting units of the light emitting element.

11. The light irradiation device according to claim 9, wherein the small regions of the lens array have a liquid crystal alignment pattern which is formed using the liquid crystal composition containing a liquid crystal compound and in which the orientation of the optical axis derived from the liquid crystal compound continuously changes rotationally along at least one in-plane direction,
   the liquid crystal alignment pattern is a concentric circular pattern in which the one directions in which the orientation of the optical axis derived from the liquid crystal compound continuously changes rotationally are concentric from an inside toward an outside, and
   the lens array is a liquid crystal lens array in which the small regions having the concentric circular pattern are two-dimensionally arranged.

12. The light irradiation device according to claim 1, wherein the phase difference plate is a λ/4 plate.

13. The light irradiation device according to claim 1, further comprising:
a polarizer which is provided upstream of the phase difference plate in a traveling direction of light.

14. The light irradiation device according to claim 1, wherein the light emitting element emits infrared rays.

15. The light irradiation device according to claim 1, wherein the light emitting element is a vertical-cavity surface-emitting laser.

16. The light irradiation device according to claim 1, wherein the light emitting element is a photonic crystal laser.

17. The light irradiation device according to claim 1, wherein the light emitting unit of the light emitting element emits light having a beam divergence angle of 3° or less.

18. The light irradiation device according to claim 1, further comprising:
a diffractive optical element which is provided downstream of the liquid crystal optical element in a traveling direction of light.

19. A sensor comprising:
the light irradiation device according to claim 1; and
a light receiving element.

20. The light irradiation device according to claim 1, wherein the phase difference plate is a λ/4 plate, and
wherein the light emitted from the light emitting element is converted into circularly polarized light and used by adjusting a phase difference of the phase difference plate according to a polarization state of the light emitted from the light emitting element.

* * * * *